United States Patent
Caron et al.

(10) Patent No.: US 10,263,602 B2
(45) Date of Patent: Apr. 16, 2019

(54) SURFACE ACOUSTIC WAVE FILTER WITH TEMPERATURE SENSOR

(71) Applicant: Skyworks Solutions, Inc., Woburn, MA (US)

(72) Inventors: Joshua James Caron, Madison, NC (US); Joel Anthony Penticoff, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/848,977

(22) Filed: Dec. 20, 2017

(65) Prior Publication Data

US 2018/0226950 A1  Aug. 9, 2018

Related U.S. Application Data

(60) Provisional application No. 62/437,519, filed on Dec. 21, 2016, provisional application No. 62/437,544, filed on Dec. 21, 2016.

(51) Int. Cl.
*H03H 9/64* (2006.01)
*H03H 9/02* (2006.01)
(Continued)

(52) U.S. Cl.
CPC .............. *H03H 9/6489* (2013.01); *H03F 1/56* (2013.01); *H03F 3/195* (2013.01); *H03F 3/245* (2013.01);
(Continued)

(58) Field of Classification Search
CPC ........... H03H 9/02685; H03H 9/02834; H03H 9/1064; H03H 9/25; H03H 9/6483;
(Continued)

(56) References Cited

U.S. PATENT DOCUMENTS

| 5,307,035 A | * | 4/1994 | Dufilie | ................... | H03H 9/027 |
| | | | | | 310/313 R |
| 5,992,215 A | | 11/1999 | Caron et al. | | |

(Continued)

FOREIGN PATENT DOCUMENTS

| JP | 01-288003 A | * | 11/1989 |
| JP | 08-079002 A | * | 3/1996 |

OTHER PUBLICATIONS

Caron, et al., "A Surface Acoustic Wave Mercury Vapor Sensor," IEEE Transactions on Ultrasonics, Ferroelectrics, and Frequency Control, vol. 45, No. 5, Sep. 1998, pp. 1393-1398.

*Primary Examiner* — Barbara Summons
(74) *Attorney, Agent, or Firm* — Knobbe Martens Olson & Bear LLP

(57) ABSTRACT

Aspects of this disclosure relate to a surface acoustic wave filter with an integrated temperature sensor. The integrated temperature sensor can be a resistive thermal device configured as a reflective grating for a surface acoustic wave resonator, for example. A radio frequency system can provide over temperature protection by reducing a power level of a radio frequency signal provided to the surface acoustic wave filter responsive to an indication of temperature provided by the integrated temperature sensor satisfying a threshold.

24 Claims, 16 Drawing Sheets

(51) Int. Cl.
*H04B 1/40* (2015.01)
*H03F 3/195* (2006.01)
*H03F 1/56* (2006.01)
*H03H 9/72* (2006.01)
*H03H 9/25* (2006.01)
*H03F 3/24* (2006.01)
*H03F 3/72* (2006.01)
*H04M 1/02* (2006.01)
*H03H 9/10* (2006.01)
*H01Q 1/24* (2006.01)
*H03F 3/19* (2006.01)

(52) U.S. Cl.
CPC ........... *H03F 3/72* (2013.01); *H03H 9/02685* (2013.01); *H03H 9/02834* (2013.01); *H03H 9/02992* (2013.01); *H03H 9/25* (2013.01); *H03H 9/6483* (2013.01); *H03H 9/725* (2013.01); *H04B 1/40* (2013.01); *H01Q 1/242* (2013.01); *H03F 3/19* (2013.01); *H03F 2200/111* (2013.01); *H03F 2200/129* (2013.01); *H03F 2200/171* (2013.01); *H03F 2200/447* (2013.01); *H03F 2200/451* (2013.01); *H03F 2203/7209* (2013.01); *H03H 9/1064* (2013.01); *H04M 1/0202* (2013.01)

(58) Field of Classification Search
CPC ................. H03H 9/6489; H03H 9/725; H03H 2009/0019; H03H 9/0566; H03H 9/0576; H03H 9/058; H03H 9/059; H03H 9/08; H04B 1/40; H04B 1/036; H01Q 1/242; H04M 1/0202; H03F 3/19; H03F 3/245; H03F 2200/129; H03F 2200/171; H03F 2200/451

USPC ..... 333/133, 193–195; 455/115.1, 127.1, 73, 455/82, 83
See application file for complete search history.

(56) References Cited

U.S. PATENT DOCUMENTS

| | | | |
|---|---|---|---|
| 6,378,370 B1 | 4/2002 | Haskell et al. | |
| 7,301,255 B2 * | 11/2007 | Ito | H03H 9/02921 310/313 R |
| 7,434,989 B2 | 10/2008 | Solie | |
| 8,680,947 B1 | 3/2014 | Costa et al. | |
| 8,838,045 B2 | 9/2014 | Caron et al. | |
| 9,118,300 B2 | 8/2015 | Martin et al. | |
| 9,232,315 B2 | 1/2016 | Martin et al. | |
| 9,246,536 B2 | 1/2016 | Caron | |
| 2004/0203552 A1 * | 10/2004 | Horiuchi | H04B 1/005 455/333 |
| 2005/0270124 A1 * | 12/2005 | Ebata | H03H 9/02921 333/193 |
| 2006/0118539 A1 | 6/2006 | Leizerovich | |
| 2006/0199547 A1 * | 9/2006 | Song | H04W 52/288 455/67.11 |
| 2012/0234818 A1 * | 9/2012 | Martin | H04R 17/00 219/210 |
| 2013/0039228 A1 | 2/2013 | Caron | |
| 2015/0048877 A1 | 2/2015 | Shen et al. | |
| 2018/0006633 A1 * | 1/2018 | Lin | H03H 9/14502 |
| 2018/0226949 A1 * | 8/2018 | Caron | H03H 9/6489 |

* cited by examiner

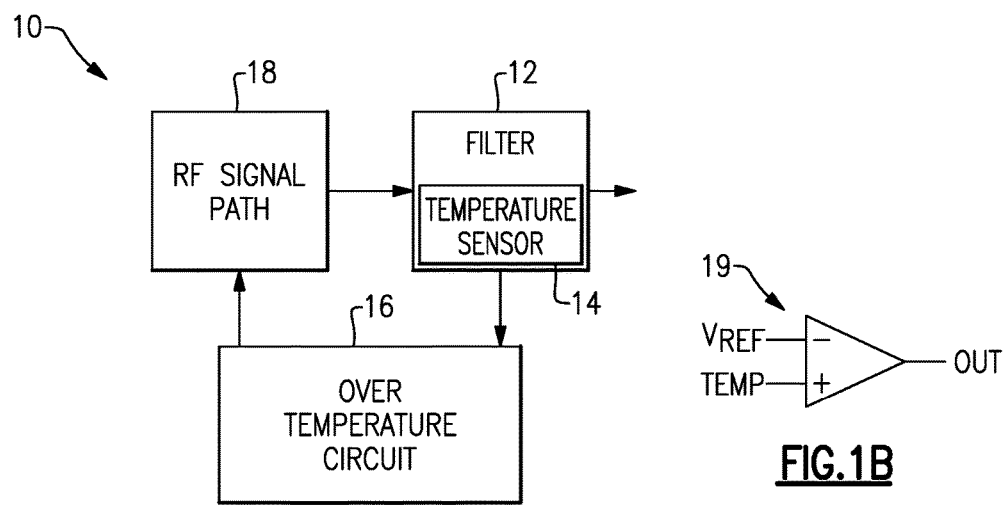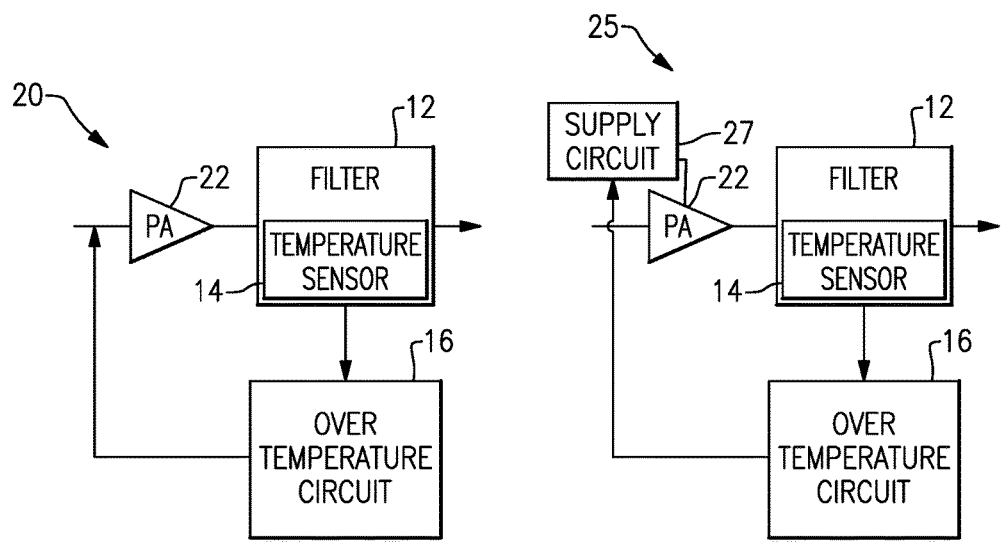

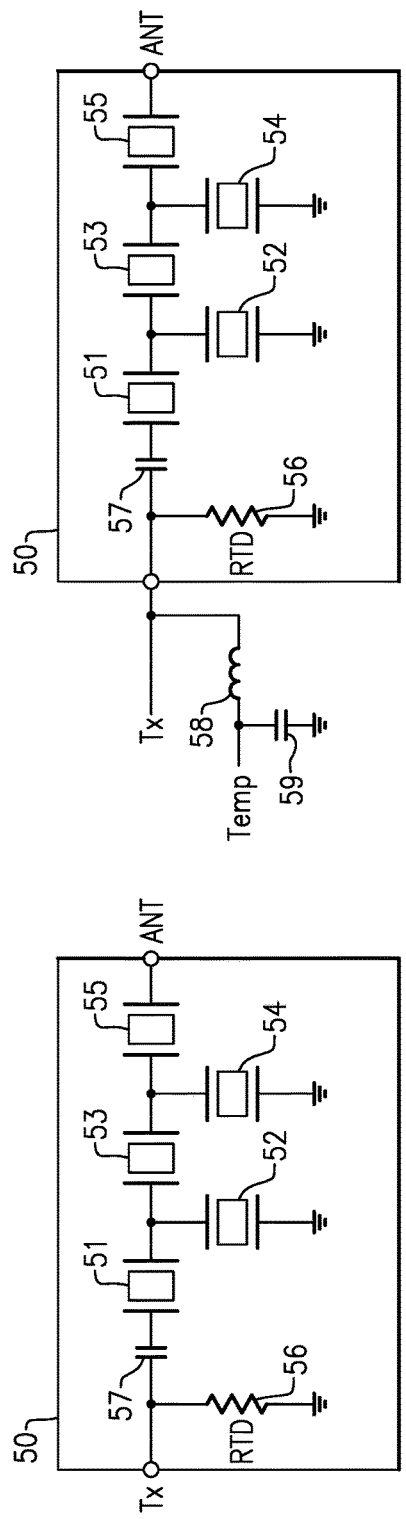

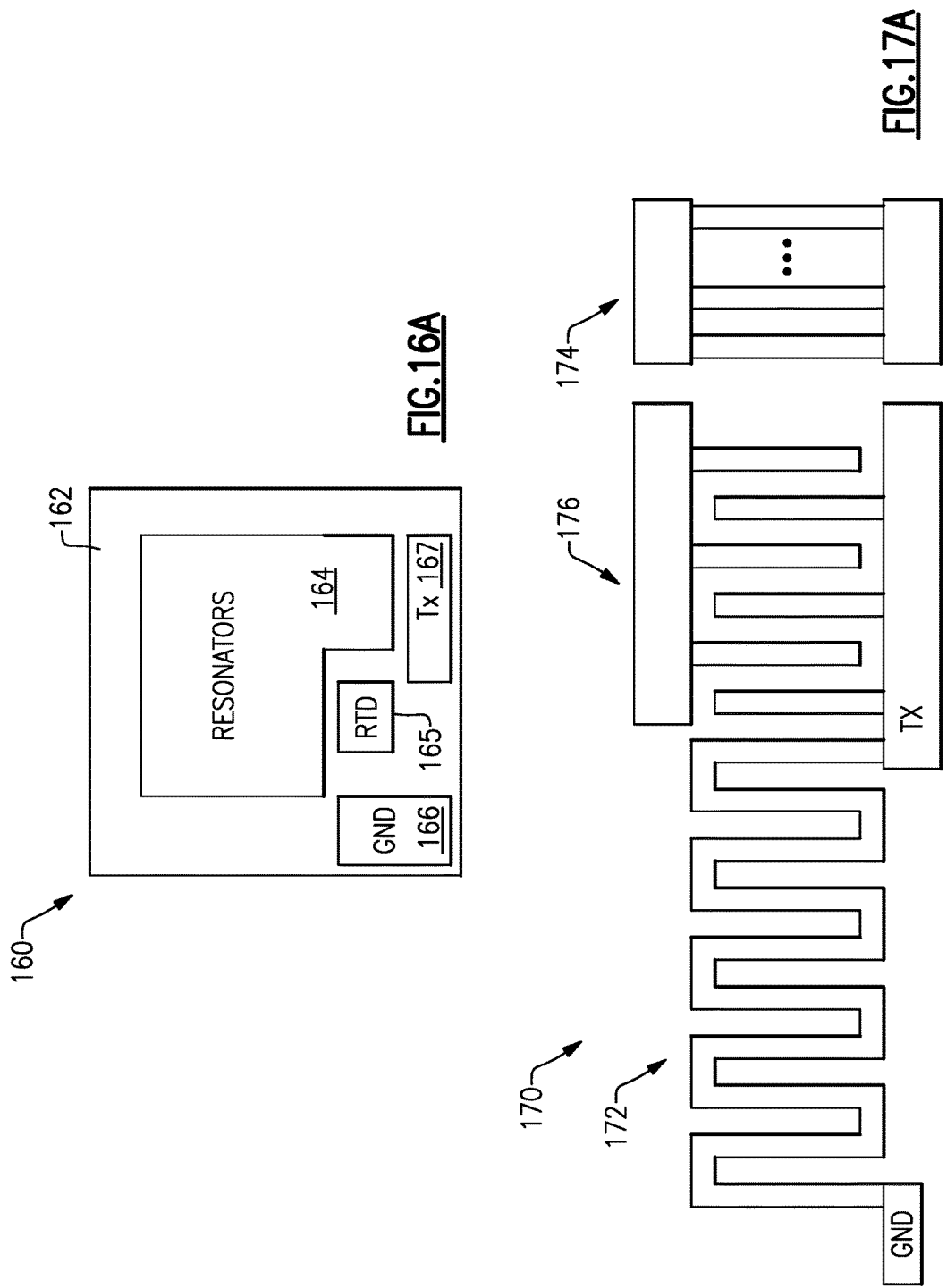

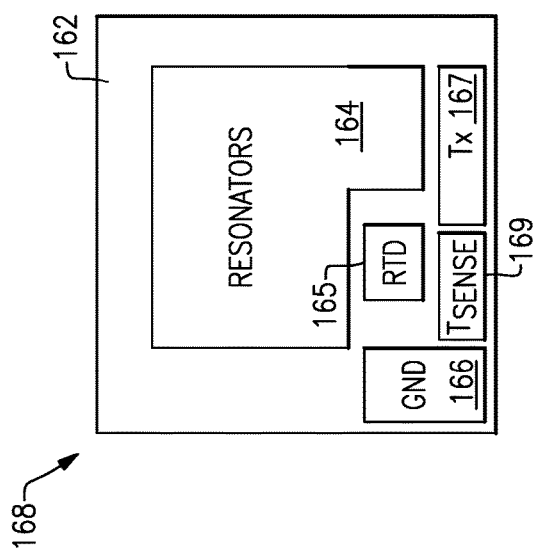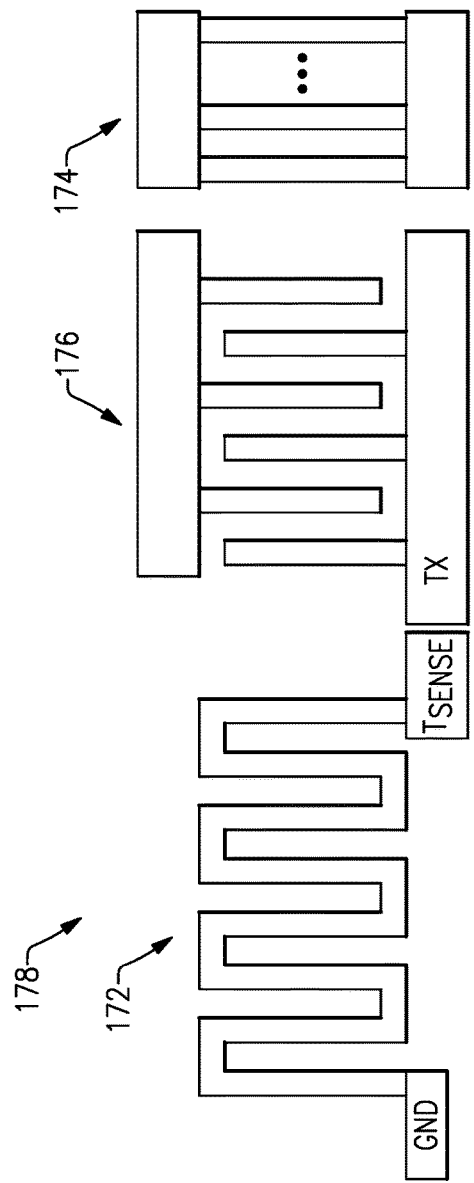

SURFACE ACOUSTIC WAVE FILTER WITH TEMPERATURE SENSOR

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application claims the benefit of priority under 35 U.S.C. § 119(e) of U.S. Provisional Patent Application No. 62/437,519, filed Dec. 21, 2016 and titled "SURFACE ACOUSTIC WAVE FILTER WITH TEMPERATURE SENSOR," the disclosure of which is hereby incorporated by reference in its entirety herein. This application claims the benefit of priority under 35 U.S.C. § 119(e) of U.S. Provisional Patent Application No. 62/437,544, filed Dec. 21, 2016 and titled "FILTER WITH OVER TEMPERATURE PROTECTION," the disclosure of which is hereby incorporated by reference in its entirety herein.

BACKGROUND

Technical Field

Embodiments of this disclosure relate to a filter with a temperature sensor and/or providing over temperature protection for a filter.

Description of Related Technology

A filter, such as an acoustic wave filter, can filter a radio frequency (RF) signal. Example acoustic wave filters include surface acoustic wave (SAW) filters and bulk acoustic wave (BAW) filters. A film bulk acoustic resonator (FBAR) filter is an example of a BAW filter.

Acoustic wave filters can be implemented in radio frequency electronic systems. For instance, filters in a radio frequency front end of a mobile phone can include acoustic wave filters. Receiving an input signal having a sufficiently high power can damage an acoustic wave filter.

BRIEF DESCRIPTION OF THE DRAWINGS

Embodiments of this disclosure will now be described, by way of non-limiting example, with reference to the accompanying drawings.

FIG. 1A is a schematic diagram of a radio frequency system with over temperature protection according to an embodiment.

FIG. 1B is a schematic diagram of an example over temperature circuit according to an embodiment.

FIG. 2A is a schematic diagram of a radio frequency system with over temperature protection according to another embodiment.

FIG. 2B is a schematic diagram of a radio frequency system with over temperature protection according to another embodiment.

FIG. 5A is a schematic diagram of an acoustic wave filter with a resistive thermal device according to an embodiment.

FIG. 5B is a schematic diagram of an acoustic wave filter with a resistive thermal device and off die circuit elements coupled to the resistive thermal device according to an embodiment.

FIG. 5C is a schematic diagram of an acoustic wave filter with a resistive thermal device and off die circuit elements coupled to the resistive thermal device according to another embodiment.

FIG. 6 is a schematic diagram of an acoustic wave filter with a resistive thermal device according to another embodiment.

FIG. 16A is a block diagram of a layout of an acoustic wave filter with an integrated resistive thermal device according to an embodiment.

FIG. 16B is a block diagram of a layout of an acoustic wave filter with an integrated resistive thermal device according to another embodiment.

FIG. 17A illustrates a serpentine resistive thermal device configured as a grating for a surface acoustic wave resonator according to an embodiment.

FIG. 17B illustrates a serpentine resistive thermal device configured as a grating for a surface acoustic wave resonator according to another embodiment.

SUMMARY OF CERTAIN INVENTIVE ASPECTS

Figure 3:
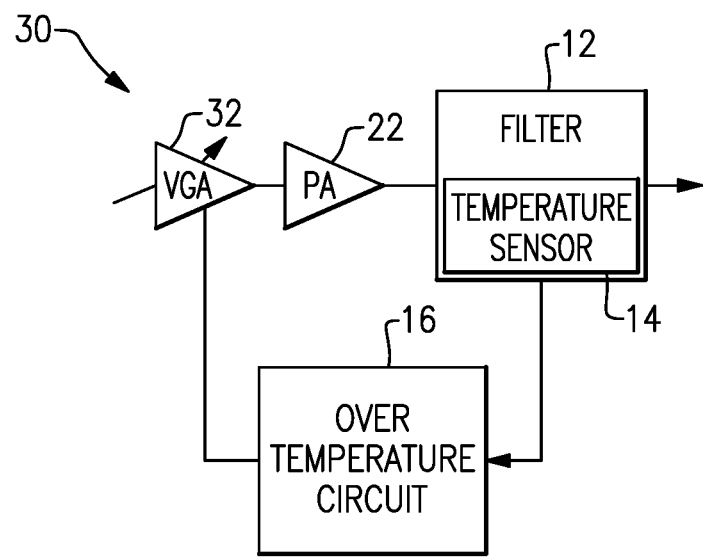
FIG. 3 is a schematic diagram of a radio frequency system with over temperature protection according to another embodiment.

The innovations described in the claims each have several aspects, no single one of which is solely responsible for its desirable attributes. Without limiting the scope of the claims, some prominent features of this disclosure will now be briefly described.

One aspect of this disclosure is a surface acoustic wave filter that includes surface acoustic wave resonators and a resistive thermal device. The surface acoustic wave resonators are configured to filter a radio frequency signal. The resistive thermal device has a resistance that changes with temperature. The resistive thermal device includes metal strips arranged in series with each other. The resistive thermal device is configured as a reflective grating of a surface acoustic wave resonator of the surface acoustic wave resonators.

The resistive thermal device can be connected between an input port of the surface acoustic wave filter and ground. The resistive thermal device can be connected to a dedicated temperature sensing port of the surface acoustic wave filter. The resistive thermal device can be connected between an output port of the surface acoustic wave filter and ground. The resistive thermal device can be positioned adjacent to an area of the surface acoustic wave filter having a high power dissipation relative to other areas of the surface acoustic wave filter.

The resistive thermal device can have a resistance of at least 500Ω. The resistive thermal device can have a resistance of at least 1 kΩ. The resistive thermal device can have a resistance in a range from 1 kΩ to 10 kΩ.

The metal strips can form a serpentine shape in plan view. The metal strips can include aluminum.

The resistive thermal device can be further configured as a reflective grating for a second surface acoustic wave resonator of the surface acoustic wave resonators.

The surface acoustic wave filter can be a transmit filter.

Another aspect of this disclosure is a radio frequency system with over temperature protection. The radio frequency system includes a surface acoustic wave filter, a radio frequency signal path, and an over temperature circuit. The surface acoustic wave filter is configured to filter a radio frequency signal. The surface acoustic wave filter includes an integrated temperature sensor. The radio frequency signal path is configured to provide the radio frequency signal to the surface acoustic wave filter. The over temperature circuit is configured to reduce a power level of the radio frequency signal responsive to an indication of temperature provided by the temperature sensor satisfying a threshold.

The integrated temperature sensor can include a resistive thermal device having a resistance that changes with temperature. The resistive thermal device can be arranged as a grating for at least one surface acoustic wave resonator of the surface acoustic wave filter. Alternatively, the temperature sensor can include a thermocouple, a resonator, or a thermistor.

The over temperature circuit can reduce the power level of the radio frequency signal to a safe level responsive to the indication of temperature provided by the temperature sensor satisfying the threshold. The safe level can represent a power level that is below a specified upper bound on a power level of an input to a surface acoustic wave filter. A radio frequency signal at the safe level should not damage the surface acoustic wave filter.

The radio frequency signal path can be a transmit signal path. The radio frequency signal path can include a power amplifier operatively coupled to the surface acoustic wave filter. The over temperature circuit can reduce a power level of an input of the power amplifier. Alternatively or additionally, the over temperature circuit can attenuate an output of the power amplifier. In some instances, the over temperature circuit can decouple the radio frequency signal from an input to the surface acoustic wave filter using a switch.

The radio frequency system can include one or more suitable features of the surface acoustic wave filters discussed herein.

Another aspect of this disclosure is a packaged module that includes a surface acoustic wave filter, an over temperature circuit, and a package enclosing the surface acoustic wave filter and the over temperature circuit. The surface acoustic wave filter is configured to filter a radio frequency signal. The surface acoustic wave filter includes an integrated temperature sensor. The over temperature circuit is operatively coupled to the integrated temperature sensor. The over temperature circuit is configured to reduce a power level of the radio frequency signal responsive to an indication of temperature provided by the temperature sensor satisfying a threshold.

The packaged module can include a second surface acoustic wave filter that includes a second integrated temperature sensor.

The surface acoustic wave filter can be a transmit filter of a multiplexer. The multiplexer can be duplexer. Alternatively, the surface acoustic wave filter can be implemented as a stand-alone transmit filter.

The packaged module can include a second acoustic wave filter and a multi-throw switch enclosed within the package, in which the multi-throw has a first throw coupled to the surface acoustic wave filter and a second throw coupled to the second acoustic wave filter. The packaged module can also include a second multi-throw switch enclosed within the package, in which the surface acoustic wave filter is coupled between the multi-throw switch and the second multi-throw switch.

The packaged module can include one or more suitable features of the surface acoustic wave filters and/or the radio frequency systems discussed herein.

Another aspect of this disclosure is a radio frequency system with over temperature protection. The radio frequency system includes a transmit signal path configured to provide a radio frequency signal, a transmit filter coupled between the transmit signal path and an antenna port, and an over temperature circuit. The transmit filter is configured to filter the radio frequency signal. The transmit filter includes an integrated temperature sensor. The over temperature circuit is configured to reduce a power level of the radio frequency signal responsive to an indication of temperature provided by the integrated temperature sensor satisfying a threshold.

The transmit filter can be an acoustic wave filter. The integrated temperature sensor can include a resistive thermal device arranged as a grating of a surface acoustic wave resonator of the acoustic wave filter. The resistive thermal device can also be arranged as a grating of a second surface acoustic wave resonator of the acoustic wave filter. The acoustic wave filter can be a surface acoustic wave filter. The acoustic wave filter can be a bulk acoustic wave filter, such as a film bulk acoustic resonator filter.

The over temperature circuit can reduce the power level of the radio frequency signal to a safe level responsive to the indication of temperature provided by the temperature sensor satisfying the threshold. The safe level can represent a power level that is below a specified upper bound on a power level of an input to a surface acoustic wave filter. A radio frequency signal at the safe level should not damage the surface acoustic wave filter.

The transmit signal path can include a power amplifier operatively coupled to the transmit filter. The over temperature circuit can reduce a power level of an input of the power amplifier. Alternatively or additionally, the over temperature circuit can attenuate an output of the power amplifier. The over temperature circuit can decouple the radio frequency signal from an input to the transmit filter using a switch in certain instances.

The integrated temperature sensor can include a resistive thermal device. The integrated temperature alternatively can include a thermocouple, a resonator, or a thermistor.

The temperature sensor can be connected between an input port of the transmit filter and ground. Alternatively, the temperature sensor can be connected between an output port of the transmit filter and ground. The temperature sensor can be connected between a dedicated temperature sensing port of the transmit filter and ground. The temperature sensor can have a first end coupled to a first port of the transmit filter and a second end coupled to a second port of the transmit filter.

Another aspect of this disclosure is a packaged module that includes a transmit filter configured to filter a radio frequency signal, an over temperature circuit, and a package enclosing the transmit filter and the over temperature circuit. The transmit filter includes an integrated temperature sensor. The over temperature circuit is operatively coupled to the integrated temperature sensor. The over temperature circuit is configured to reduce a power level of the radio frequency signal responsive to an indication of temperature provided by the temperature sensor satisfying a threshold.

The packaged module can include a second transmit filter that includes a second integrated temperature sensor.

The transmit filter can be included in a multiplexer. The multiplexer can be a duplexer. Alternatively, the transmit filter can be configured as a stand-alone transmit filter.

The packaged module can include a second transmit filter and a multi-throw switch enclosed within the package, in which the multi-throw has a first throw coupled to the transmit filter and a second throw coupled to the second transmit filter. The packaged module can also include a second multi-throw switch enclosed within the package, the transmit filter being coupled between the multi-throw switch and the second multi-throw switch.

The packaged module can include one or more suitable features of the transmit filters and/or the radio frequency systems discussed herein.

Another aspect of this disclosure is a wireless communication device. The wireless communication device include a radio frequency front end and an antenna operatively coupled to a transmit filter of the radio frequency front end. The radio frequency front end includes a transmit filter configured to filter a radio frequency signal. The transmit filter includes an integrated temperature sensor. The radio frequency front end also includes an over temperature circuit configured to reduce a power level of the radio frequency signal responsive to an indication of temperature provided by the integrated temperature sensor satisfying a threshold.

The wireless communication device can be a mobile phone.

The wireless communication device can include a transceiver in communication with the radio frequency front end, in which the over temperature circuit configured to provide an over temperature signal to the transceiver to reduce the power level of the radio frequency signal.

The wireless communication device can include one or more suitable features of any of the transmit filters discussed herein, any of the radio frequency systems discussed herein, any of the packaged modules discussed herein, or any combination thereof.

Another aspect of this disclosure is a method of over temperature protection in a radio frequency system. The method includes providing an indication of temperature of a filter using a temperature sensor integrated in the filter, the filter being configured to filter a radio frequency signal; detecting that the indication of temperature of the filter satisfies a threshold; and in response to the detecting, reducing a power level of the radio frequency signal provided to the filter.

The filter can be a surface acoustic wave filter and the integrated temperature sensor can be a resistive thermal device.

Reducing the power level of the radio frequency signal can include reducing a power level of an input signal to a power amplifier that is operatively coupled to the filter. Reducing the power level of the radio frequency signal can include decoupling a power amplifier from the filter.

The method can include transmitting the radio frequency signal using an antenna of a mobile device.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 15/848,768, titled "FILTER WITH OVER TEMPERATURE PROTECTION," filed on even date herewith, the entire disclosure of which is hereby incorporated by reference herein.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A filter, such as a surface acoustic wave filter, in a transmit path of a cellular handset can be damaged if an input power of a signal provided to the filter is too high. The filter can be implemented in a multiplexer, such as a duplexer. A closed-loop power controller can attempt to maintain a substantially constant forward power out of an antenna of the cellular handset by adjusting the input power from a transceiver to compensate for varying loss at the antenna of the cellular handset. In certain high Voltage Standing Wave Ratio (VSWR) scenarios, an output loss can be sufficiently high that, in an attempt to maintain a desired power out of the antenna, the input power of the signal provided by the filter can be pushed beyond the limits of the filter. This can irreparably damage the filter in some instances.

To avoid damage to filters due to relatively high input power of a signal provided to a filter input, some filters have been designed to withstand relatively extreme power and VSWR conditions. However, this can add significant challenges to the filter design process and can limit how small the physical size of a filter can be.

Dissipated power in a filter or duplexer can manifest as thermal energy (e.g., a locally elevated temperature on a filter die). Accordingly, a given amount of dissipated power can generate a corresponding temperature rise. Failure events, such as damage to the filter, can be preceded by an excessive rise in temperature. By integrating a temperature sensor onto the filter substrate adjacent to an area of relatively high power dissipation, the dissipated power can be monitored in situ. An over temperature circuit can be implemented to reduce input power to the filter in response to a particular temperature threshold being exceeded. The over temperature circuit can be implemented using a relatively straightforward complementary metal oxide semiconductor (CMOS) circuit or other similar technology.

A surface acoustic wave (SAW) filter typically includes a plurality of SAW resonators, each of which can include at least two reflective gratings. The gratings can be arranged to reflect acoustic energy. Accordingly, the gratings can be referred to as acoustic reflectors. One or more of the gratings can include a plurality of periodically distributed relatively thin metal strips connected electrically in parallel with each other. Because these metal strips are part of the acoustically active area of a SAW filter, the electrode geometry can be precisely controlled. Taking advantage of precisely controlled metal strip geometry, a highly reproducible resistive thermal device (RTD) can be formed by reconfiguring the parallel connected metal strips of one or more reflective gratings into series connections. The resistance of the resistive thermal device changes with temperature. By chaining a relatively large number of reflective strips together in series, a resistive thermal device having relatively large resistance can be realized. The relatively large resistance can be at least a kilo-Ohm (kΩ) or several kilo-Ohms.

If the resistance of the resistive thermal device is sufficiently large (e.g., at least 500Ω or at least 1 kΩ), the resistive thermal device can be connected in shunt with an existing direct current (DC) blocked filter input or filter output to allow temperature monitoring without extra device connections. Connecting the resistive thermal device in shunt with an existing DC blocked filter input or filter output can allow temperature monitoring without significantly increasing insertion loss. For example, in a typical 50Ω system, a shunt-connected resistance of 3.5 kΩ can add only about 0.05 dB of additional insertion loss.

Since a resistive thermal device of series connected metal strips can reconfigure existing device geometries of a SAW filter, the resistive thermal device can be implemented without consuming extra area on the filter die. A SAW filter with an integrated resistive thermal device formed of series connected reflective gratings can be included in a relatively inexpensive solution that can relax ruggedness requirements and allow filter size and cost reductions.

Aspects of this disclosure relate to preventing irreparable damage to a filter due to certain VSWR conditions, which can be a catastrophic event without over temperature projection for the filter. Reducing the filter input power and/or shutting off a power amplifier in a transmit path arranged to provide a radio frequency signal to the filter are some ways to prevent damage to the filter due to excessive heating. Using an indication of temperature provided by an integrated temperature sensor, such as an RTD, an over temperature circuit can detect conditions that could cause irreparable damage to the filter and prevent such damage to the filter.

A serpentine resistive thermal device or another integrated temperature sensor can be implemented on bulk acoustic wave (BAW) filters and/or other filter technologies. BAW filters can be manufactured with tightly controlled metal processes that can be used to form an RTD. This can result in RTDs with precise resistances that can be formed in a repeatable manner.

Any principles and advantages discussed herein can be applied to a variety of radio frequency (RF) systems as suitable. Such radio frequency systems can implement over temperature protection. An integrated temperature sensor of a filter can provide an indication of temperature of the filter to an over temperature circuit. The over temperature circuit can detect whether an output of the integrated temperature sensor satisfies a threshold. Responsive to the output of the temperature sensor satisfying the threshold (e.g., exceeding the threshold), the over temperature circuit can reduce a power level and/or signal level of a radio frequency signal provided to the filter. The over temperature circuit can reduce the power level and/or signal level of the radio frequency signal in any suitable manner. FIGS. 1A, 2A, 2B, 3, and 4 provide examples of radio frequency systems with over temperature protection. Any suitable combination of features of these radio frequency systems can be implemented.

FIG. 1A is a schematic diagram of a radio frequency system 10 with over temperature protection according to an embodiment. As illustrated, the radio frequency system 10 includes a filter 12 with an integrated temperature sensor 14, an over temperature circuit 16, and a radio frequency signal path 18.

The filter 12 can filter an RF signal. Transmit filters can receive RF signals having a higher signal level than receive filters in typical RF systems. Accordingly, it can be advantageous to provide over temperature protection for transmit filters. Thus, the filter 12 can be a transmit filter, such as a transmit filter of a duplexer. The filter 12 can be a SAW filter, for example. In some instances, the filter 12 can be a BAW filter, such as an FBAR filter. The filter 12 can include one or more SAW resonators and one or more BAW resonators in some applications.

The integrated temperature sensor 14 can be on the same filter substrate as elements of the filter 12 that perform filtering. As an example, acoustic wave resonators of the filter 12 and the temperature sensor 14 can be on the same filter substrate. The integrated temperature sensor 14 can be any suitable temperature sensor. For instance, the temperature sensor 14 can be an RTD. The resistive thermal device can include a plurality of metal strips arranged as a grating for one or more surface acoustic wave resonators. Such a resistive thermal device can be serpentine in plan view. In some other instances, the temperature sensor 14 can include a thermocouple. The temperature sensor 14 can include one or more resonators having a resonant frequency that changes with temperature in certain instances. The temperature sensor 14 can include a temperature sensor in accordance with any of the principles and advantages discussed herein as suitable.

Although the filter 12 is illustrated as providing a signal indicative of temperature to the over temperature circuit 16 by way of a dedicated signal line in FIG. 1A, the signal indicative of temperature can be provided to the over temperature circuit 16 in a variety of ways. For instance, the over temperature circuit 16 can obtain an indication of temperature from the temperature sensor 14 from an input of the filter 12, an output of the filter 12, or from a temperature sensor 14 arranged between two ports of the filter 12. In some instances, a filtering circuit, such as an RC circuit or an LC circuit, can be coupled between an input of the filter 12 arranged to provide an indication of temperature and the over temperature circuit 16. According to some other instances in which the filter 12 includes two ports across which the temperature sensor 14 is coupled, temperature sensors in different filters can be daisy chained. Such a daisy chain can reduce the number of I/O signals to the over temperature circuit 16 in certain instances. The over temperature circuit 16 can obtain an indication of temperature from a temperature sensor 14 of the filter 12 in accordance with any of the principles and advantages of the example acoustic wave filters of FIGS. 5A to 11.

The over temperature circuit 16 can detect whether an output of the temperature sensor 14 satisfies a threshold. This can include detecting whether the temperature of the filter 12 is close to a temperature that can damage the filter. The over temperature circuit 16 can reduce an input power at an input port of the filter 12 in response to detecting that a temperature of the filter 12 is relatively close to a temperature that could damage the filter 12 or otherwise impair the function of the filter 12. For instance, the over temperature circuit 16 can reduce a signal level of a radio frequency signal provided to the filter 12 in response to the output of the temperature sensor satisfying the threshold. In certain applications, the over temperature circuit 16 can cause a duty cycle of a power amplifier in the RF signal path 18 to be reduced in response to detecting that a temperature associated with the filter 12 satisfies a threshold. The over temperature circuit 16 can provide an output signal to the RF signal path 18 that causes the radio frequency signal provided to the filter 12 to be reduced. The over temperature circuit 16 can reduce a power level of the radio frequency signal provided to the filter 12 to a safe level. The safe level can represent a power level that is below a specified upper bound on a power level of an input to the filter 12. A radio frequency signal at the safe level should not damage the filter 12. The over temperature circuit 16 can reduce the amplitude of the radio frequency signal provided to the filter 12 to be approximately zero in some instances. This can effectively cause the filter 12 to stop filtering the radio frequency signal provided by the RF signal path 18.

The over temperature circuit 16 can be implemented by any suitable circuitry arranged to detect that an indication of temperature from the temperature sensor 14 satisfies a threshold and to assert an over temperature signal in response. The over temperature circuit 16 can be implemented by a controller, for example. The over temperature circuit 16 can be implemented by resistors arranged in a bridge configuration with a resistive thermal device temperature sensor, as another example. A variety of different circuits arranged to detect a change in resistance of a resistive thermal device temperature sensor can be implemented.

The RF signal path 18 can be any suitable signal path arranged to provide a radio frequency signal to the filter 12. The RF signal path 18 can be a transmit path. The RF signal path 18 can include a power amplifier, for example.

FIG. 1B is a schematic diagram of an example over temperature circuit 19 according to an embodiment. As shown in FIG. 1B, the over temperature circuit 19 can include a comparator arranged to compare an indication of temperature TEMP with a reference signal $V_{REF}$. These signals can be voltage signals. The reference signal $V_{REF}$ can represent a threshold at which the indication of temperature TEMP is at or near a temperature corresponding to an over temperature condition. When the indication of temperature TEMP exceeds the reference signal $V_{REF}$, an over temperature signal OUT can be asserted to indicate an over temperature condition.

FIG. 2A is a schematic diagram of a radio frequency system 20 with over temperature protection according to another embodiment. The radio frequency system 20 is like the radio frequency system 10 of FIG. 1A, except that the radio frequency system 20 includes a power amplifier 22 arranged to receive a bias signal from the over temperature circuit 16. The over temperature circuit 16 of FIG. 2A can provide the bias signal so as to attenuate the output of the power amplifier 22 in response to detecting that a temperature associated with the filter 12 satisfies a threshold. The bias signal can reduce the gain of the power amplifier 22 to approximately zero in certain instances.

FIG. 2B is a schematic diagram of a radio frequency system 25 with over temperature protection according to another embodiment. The radio frequency system 25 is like the radio frequency system 20 of FIG. 2A, except that the over temperature circuit 16 provides an over temperature signal to a supply circuit 27 instead of the power amplifier 22. The supply circuit 27 can reduce and/or limit a supply voltage to the power amplifier 22 in response to the over temperature signal being asserted. In some instances, the supply voltage circuit can bring a supply voltage for the power amplifier 22 close to 0 Volts in response to the over temperature circuit 16 detecting that a temperature associated with the filter 12 satisfies a threshold. The supply circuit 27 can include an envelope tracking modulator in certain applications. In such instances, the over temperature signal from the over temperature circuit 16 can limit a supply voltage provided by the envelope tracking modulator.

FIG. 3 is a schematic diagram of a radio frequency system 30 with over temperature protection according to another embodiment. The radio frequency system 30 is like the radio frequency system 10 of FIG. 1A, except that the radio frequency system 30 includes a power amplifier 22 and a variable gain amplifier 32 arranged to receive an input from the over temperature circuit 16. The over temperature circuit 16 of FIG. 3 can adjust a gain of the variable gain amplifier 32 to cause the output of the power amplifier 22 to be attenuated in response to detecting that a temperature associated with the filter 12 satisfies a threshold. The variable gain amplifier 32 can be included in a transmitter, such as a transmitter of a transceiver.

Figure 4:
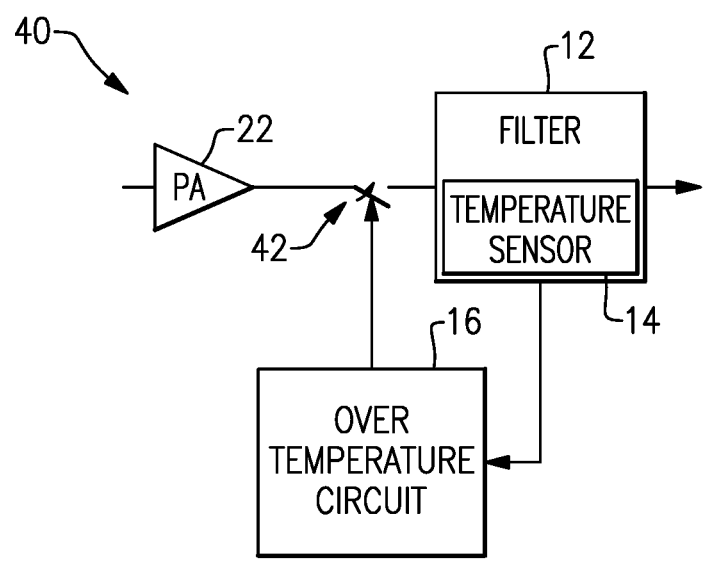
FIG. 4 is a schematic diagram of a radio frequency system with over temperature protection according to another embodiment.

FIG. 4 is a schematic diagram of a radio frequency system 40 with over temperature protection according to another embodiment. The radio frequency system 40 is like the radio frequency system 20 of FIG. 2A, except that the radio frequency system 40 includes a switch 42 coupled between the power amplifier 22 and the filter 12 and an output of the over temperature circuit 16 is provided to the switch 42. The over temperature circuit 16 of FIG. 4 can control the switch 42 so as to attenuate the output of the power amplifier 22 in response to detecting that a temperature associated with the filter 12 satisfies a threshold. In some instances, the over temperature circuit 42 can turn off the switch 42 in response to detecting that the temperature associated with the filter 12 satisfies the threshold. This can decouple the output of the power amplifier 22 from an input of the filter 12. When the output of the power amplifier 22 is decoupled from the input of the filter 12, this can reduce the amplitude of the radio frequency signal provided to the input of the filter 12 to approximately zero. The illustrated switch 42 can represent a throw of a multi-throw radio frequency switch.

Aspects of this disclosure can be implemented in an acoustic wave filter. For instance, an acoustic wave filter can include a plurality of resonators and a resistive thermal device. The resistive thermal device has a resistance that varies with temperature. Accordingly, the resistive thermal device can be a temperature sensor. Some or all of the resonators of an acoustic wave filter and the resistive thermal device can be implemented on a common filter substrate. The resonators can include SAW resonators and/or BAW resonators. In a surface acoustic wave filter, any of the resistive thermal devices of FIGS. 5A to 9 can be configured as a reflective grating for one or more surface acoustic wave resonators of the surface acoustic wave filter. FIGS. 5A to 9 illustrate example acoustic wave filters with resistive thermal devices. Any suitable combination of features of these acoustic wave filters can be implemented together. Any of the principles and advantages of these acoustic wave filters can be implemented in any of the radio frequency systems of FIGS. 1A, 2A, 2B, 3, and 4, for example.

FIG. 5A is a schematic diagram of an acoustic wave filter 50 with a resistive thermal device according to an embodiment. As illustrated, the acoustic wave filter 50 includes resonators 51, 52, 53, 54, and 55, resistive thermal device 56, and capacitor 57. In the acoustic wave filter 50, the resistive thermal device 56 is connected to the transmit port Tx. This can enable temperature sensing without significantly increasing insertion loss and without adding an additional port of the acoustic wave filter 50.

The resonators 51, 52, 53, 54, and 55 are together arranged as a filter configured to filter an RF signal. As illustrated, the filter is a ladder filter. Resonators 51, 53, and 55 are arranged as series resonators. Resonators 52 and 54 are arranged as shunt resonators. The acoustic wave filter 50 can include any suitable number of series resonators and any suitable number of shunt resonators. The resonators 51, 52, 53, 54, and 55 are illustrated as one port resonators. In some instances, one or more resonators of the acoustic wave filter 50 can be other types of resonators.

In the acoustic wave filter 50, the resistive thermal device 56 is coupled to a transmit port Tx. As illustrated, all of the illustrated resonators of the acoustic wave filter 50 are coupled between the resistive thermal device 56 and the antenna port ANT. The resistive thermal device 56 can have a resistance of at least 500Ω or at least 1 kΩ, for example. In some instances, the resistance of the resistive thermal device 56 is in a range from 1 kΩ to 10 kΩ.

The resistive thermal device 56 of FIG. 5A is connected in shunt with a direct current (DC) blocked filter input to allow temperature monitoring without extra device connections. The transmit port Tx can receive a radio frequency signal in which a DC component is blocked. For instance, a DC blocking capacitor can be disposed in a signal path to the transmit port Tx of the acoustic wave filter 50.

As illustrated, the capacitor 57 is arranged in series between the transmit port Tx and the resonators 51, 52, 53, 54, and 55. In the acoustic wave filter 50, the capacitor 57 is coupled between the resistive thermal device 56 and the resonators 51, 52, 53, 54, and 55. The capacitor 57 can block a DC voltage associated with the resistive thermal device 56 from the resonators 51, 52, 53, 54, and 55. The capacitor 57 can be manufactured in a precise and repeatable manner. The capacitor 57 can have a capacitance of a few picofarads (pF), for example. In some instances (not illustrated), a shunt capacitor can also be included in parallel with the resistive thermal device 56 to provide low pass filtering. Such a low pass filter can reduce cross-band isolation issues in some instances.

With the resistive thermal device 56 connected to the transmit port Tx of the acoustic wave filter 50, an LC circuit and/or an RC circuit can be coupled between the transmit port Tx and an over temperature circuit. This can provide filtering such that the over temperature circuit can receive a DC component for sensing temperature. The filtering can block an RF signal component from being provided to the over temperature circuit. The filtering circuit (e.g., the LC circuit or RC circuit be coupled between the transmit port Tx and an over temperature circuit) can be implemented external to the acoustic wave filter 50.

FIG. 5B is a schematic diagram of an acoustic wave filter 50 with a resistive thermal device 56 and off die circuit elements coupled to the resistive thermal device according to an embodiment. In FIG. 5B, an LC circuit that includes an inductor 58 and a shunt capacitor 59 is coupled to the resistive thermal device 56. As illustrated, the LC circuit is coupled to an input port of the acoustic wave filter 50. The LC circuit is implemented off of a die that includes the acoustic wave filter 50. The LC circuit can block the RF component of the signal at the transmit port Tx and pass the DC component of the signal at the transmit port Tx. Accordingly, an indication of temperature TEMP for an over temperature circuit can be a DC signal. The indication of temperature TEMP is an analog signal in FIG. 5B.

FIG. 5C is a schematic diagram of an acoustic wave filter 60 with a resistive thermal device 56 and off die circuit elements coupled to the resistive thermal device according to an embodiment. The acoustic wave filter 60 will be discussed in more detail in connection with FIG. 6. In FIG. 5C, the LC circuit that includes the inductor 58 and the shunt capacitor 59 is coupled to an output port of the acoustic wave filter 60. As illustrated, the output port is an antenna port ANT. The LC circuit is implemented off of a die that includes the acoustic wave filter 60. The LC circuit can block the RF component of the signal at the antenna port ANT and pass the DC component of the signal at the antenna port ANT. Accordingly, an indication of temperature TEMP for an over temperature circuit can be a DC signal. The indication of temperature TEMP is an analog signal in FIG. 5C.

FIG. 6 is a schematic diagram of an acoustic wave filter 60 with a resistive thermal device according to another embodiment. The acoustic wave filter 60 is like the acoustic wave filter 50 of FIG. 5A, except that the resistive thermal device 56 of the acoustic wave filter 60 is connected to an output port of the filter. Accordingly, the resonators 51, 52, 53, 54, and 55 of the acoustic wave filter 60 are coupled between the resistive thermal device 56 and the transmit port Tx. In the acoustic wave filter 60, the capacitor 57 is also connected in series between an output port of the filter 60 and the resonators 51, 52, 53, 54, and 55. As shown in FIG. 6, the output port can be an antenna port ANT. In the acoustic wave filter 60, the capacitor 57 is coupled between the resistive thermal device 56 and the resonators 51, 52, 53, 54, and 55. The capacitor 56 can block a DC voltage associated with the resistive thermal device 56 from the resonators 51, 52, 53, 54, and 55. The acoustic wave device 60 can enable temperature sensing without significantly increasing insertion loss and an existing filter port can be used for temperature sensing.

Figure 7:
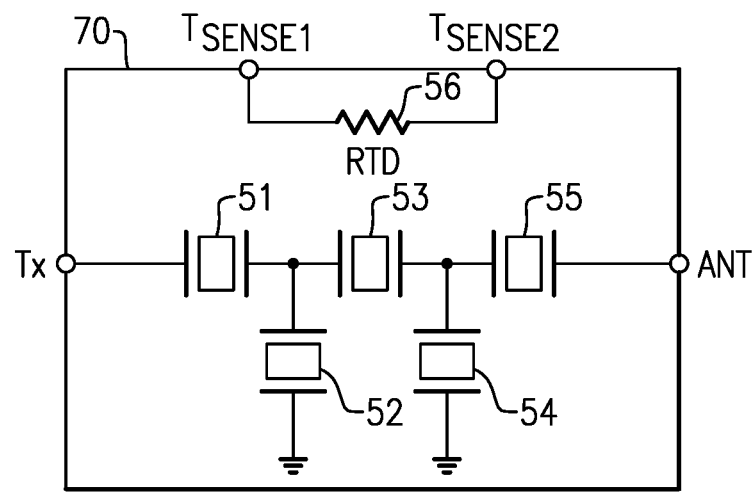
FIG. 7 is a schematic diagram of an acoustic wave filter with a resistive thermal device according to another embodiment.

FIG. 7 is a schematic diagram of an acoustic wave filter 70 with a resistive thermal device according to another embodiment. The acoustic wave filter 70 is like the acoustic wave filter 50 of FIG. 5A and the acoustic wave filter 60 of FIG. 6, except that the capacitor 57 is omitted and the resistive thermal device 56 of the acoustic wave filter 70 has a first end connected to a first dedicated sensing port $T_{SENSE1}$ and a second end connected to a second dedicated sensing port $T_{SENSE2}$. An over temperature circuit can detect a resistance of the resistive thermal device 56 of the acoustic wave filter 70 across the first dedicated port and the second dedicated port. The resistive thermal device 56 of the acoustic wave filter 70 can be daisy chained with one or more resistive thermal devices of other acoustic wave filters. Implementing such a daisy chain can reduce inputs to an over temperature circuit configured to detect an over temperature condition associated with a plurality of acoustic wave filters relative to the acoustic wave filter 60 of FIG. 6. Alternatively or additionally, such a daisy chain can reduce a number of over temperature circuits used to detect over temperature conditions associated with a plurality of acoustic wave filters.

Figure 8:
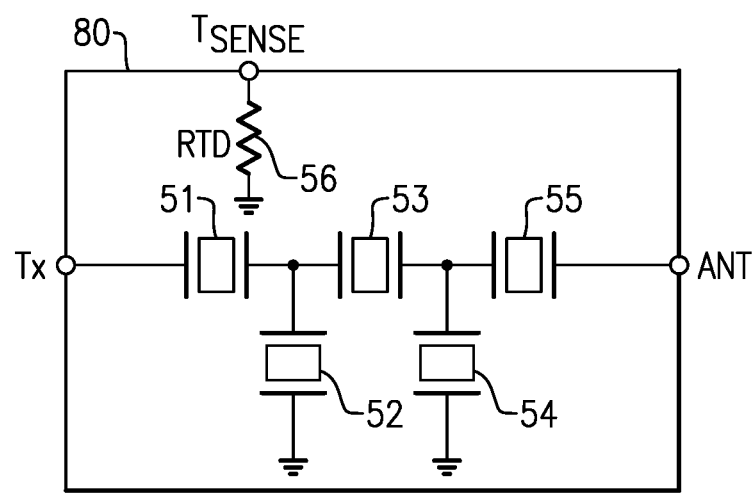
FIG. 8 is a schematic diagram of an acoustic wave filter with a resistive thermal device according to another embodiment.

FIG. 8 is a schematic diagram of an acoustic wave filter 80 with a resistive thermal device 56 according to another embodiment. The acoustic wave filter 80 is like the acoustic wave filter 70 of FIG. 7, except that the resistive thermal device 56 of the acoustic wave filter 80 is connected between a dedicated temperature sensing port $T_{SENSE}$ and ground. An over temperature circuit can be coupled to the dedicated temperature sensing port $T_{SENSE}$ and detect a resistance of the resistive thermal device 56 of the acoustic wave filter 80.

Figure 9:
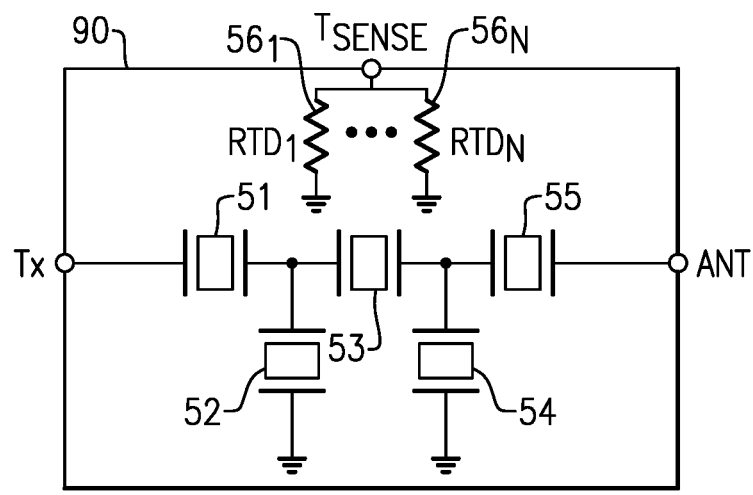
FIG. 9 is schematic diagram of an acoustic wave filter with resistive thermal devices according to an embodiment.

FIG. 9 is schematic diagram of an acoustic wave filter 90 with resistive thermal devices according to an embodiment. The acoustic wave filter 90 is like the acoustic wave filter 80 of FIG. 8, except that the acoustic wave filter 90 includes a plurality of resistive thermal devices $56_1$ to $56_N$ in parallel with each other. The resistive thermal devices $56_1$ to $56_N$ are each connected between a dedicated temperature sensing port $T_{SENSE}$ and ground. With a plurality of resistive thermal devices $56_1$ to $56_N$ in parallel, a total resistance change versus temperature can decrease. Accordingly, finer changes in temperature can be detected relative to a single resistive thermal device. An over temperature circuit can be coupled to the dedicated temperature sensing port $T_{SENSE}$ and detect a resistance of the resistive thermal devices $56_1$ to $56_N$ of the acoustic wave filter 90.

Figure 10:
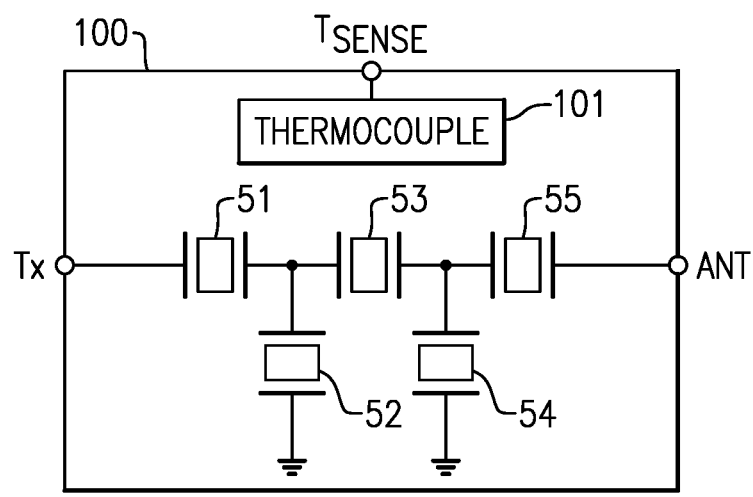
FIG. 10 is schematic diagram of an acoustic wave filter with an integrated temperature sensor that includes a thermocouple according to an embodiment.
Figure 11:
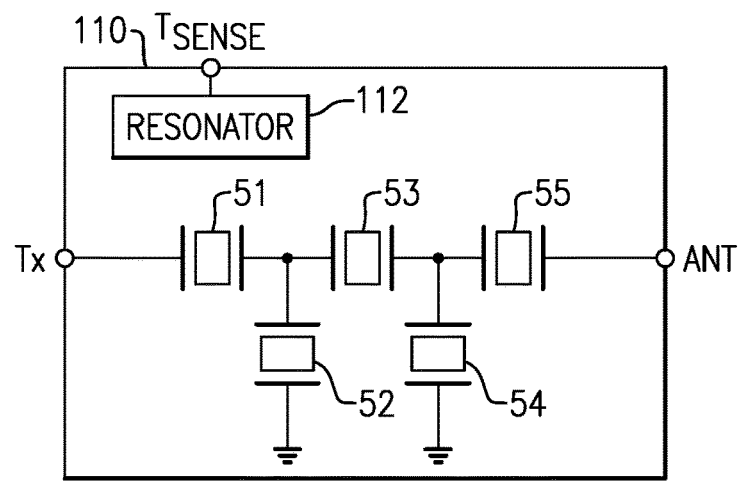
FIG. 11 is schematic diagram of an acoustic wave filter with an integrated temperature sensor that includes a resonator according to an embodiment.

While FIGS. 5A to 9 illustrate filters that include a resistive thermal device, other suitable temperature sensors can be included in an acoustic wave filter. Such other suitable temperature sensors can be used to implement any suitable principles and advantages of over temperature protection discussed herein. An acoustic wave filter can include an integrated temperature that includes, for example, a thermocouple, one or more resonators, a thermistor, or any combination thereof. A thermistor can be implemented in place of a resistive thermal device in any of FIGS. 5A to 9. FIGS. 10 and 11 illustrate example acoustic wave filters with integrated temperature sensors. Any suitable combination of the acoustic wave filters of FIGS. 5A to 11 can be implemented together with each other. For instance, two different types of temperature sensors can be included in an acoustic wave filter. Any of the principles and advantages of the acoustic wave filters of FIGS. 10 to 11 can be implemented in any of the radio frequency systems of FIGS. 1A, 2A, 2B, 3, and 4.

FIG. 10 is schematic diagram of an acoustic wave filter 100 with an integrated temperature sensor that includes a thermocouple 101 according to an embodiment. The acoustic wave filter 100 is like the acoustic wave filter 80 of FIG. 8 except that the acoustic wave filter 100 includes the thermocouple 101 in place of a resistive thermal device 56. An over temperature circuit can be coupled to the thermocouple 101 to detect a temperature associated with the acoustic wave filter 100. The thermocouple 101 can include two materials forming electrical junctions at different temperature. The thermocouple 101 can provide a temperature-dependent voltage that is an indication of temperature. The thermocouple 101 can include metals, such as aluminum and molybdenum, which can be metals in a SAW filter stack.

FIG. 11 is schematic diagram of an acoustic wave filter 110 with an integrated temperature sensor that includes a resonator 112 according to an embodiment. The acoustic wave filter 110 is like the acoustic wave filter 100 of FIG. 10 except that the acoustic wave filter 110 includes a resonator 112 instead of a thermocouple 101. The resonator 112 can include a SAW resonator or a BAW resonator, for example. The resonator 112 can be a standalone device. A change in temperature of the acoustic wave filter 110 can cause a resonant frequency of the resonator 112 to change. An over temperature circuit can detect the change in resonant frequency of the resonator 112. The resonator 112 can be interrogated with a different frequency that a frequency of an RF signal provided to the transmit port Tx of the acoustic wave filter 110. The resonator 112 can be arranged in shunt or in series. If arranged in series, the resonator can be coupled across two ports of the acoustic wave filter.

In some instances, temperature sensing ports of a plurality of acoustic wave filters 110 can be daisy chained. To differentiate indications of temperature associated with different daisy chained filters, the temperature sensing resonator of each filter can be interrogated with a different frequency, for example. As another example, indications of temperature associated with different daisy chained temperature sensors can be differentiated by having respective temperature sensing resonators interrogated at different times.

Acoustic wave filters can be implemented in a multiplexer in an RF system. For instance, a duplexer including a transmit filter and a receive filter coupled to a common node can each include an acoustic wave filter. Any suitable principles and advantages discussed herein can be implemented in other multiplexers, such as quadplexers, hexaplexers, octoplexers, and the like. Transmit signals can have relatively high power. When the power gets sufficiently high, such as in certain high VWSR scenarios, the transmit filter can be damaged. Accordingly, temperature sensing in accordance with any suitable principles and advantages discussed herein can be implemented in association with a transmit filter included in a multiplexer. Alternatively, temperature sensing in accordance with any suitable principles and advantages discussed herein can be implemented in association with a stand-alone transmit filter. For instance, such a stand-alone transmit filter can be implemented in time-domain duplex (TDD) applications. As one example, temperature sensing in accordance with any suitable principles and advantages discussed herein can be implemented in a stand-alone Band 41 transmit filter in a TDD application.

Figure 12A:
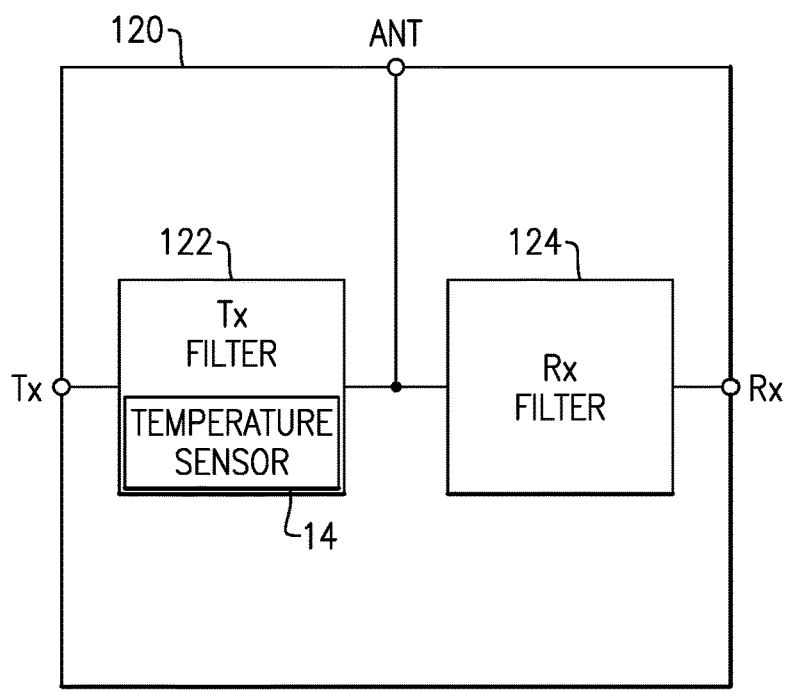
FIG. 12A is schematic block diagram of a duplexer that includes a transmit filter with an integrated temperature sensor according to an embodiment.

FIG. 12A is schematic block diagram of a duplexer 120 that includes a transmit filter 122 with an integrated temperature sensor 14 according to an embodiment. The duplexer 120 also includes a receive filter 124 that is coupled to the transmit filter 122 at an antenna node ANT. The transmit filter 122 can include an acoustic wave filter with an integrated temperature sensor 14 in accordance with any principles and advantages discussed herein.

Although certain embodiments discussed herein relate to transmit filters with integrated sensors, any suitable principles and advantages discussed herein can be applied to receive filters. A receive filter can include an integrated temperature sensor for a variety of reasons. In some instances, an integrated sensor of a receive filter can be used to compensate for a variation in a frequency response of the receive filter over temperature.

Figure 12B:
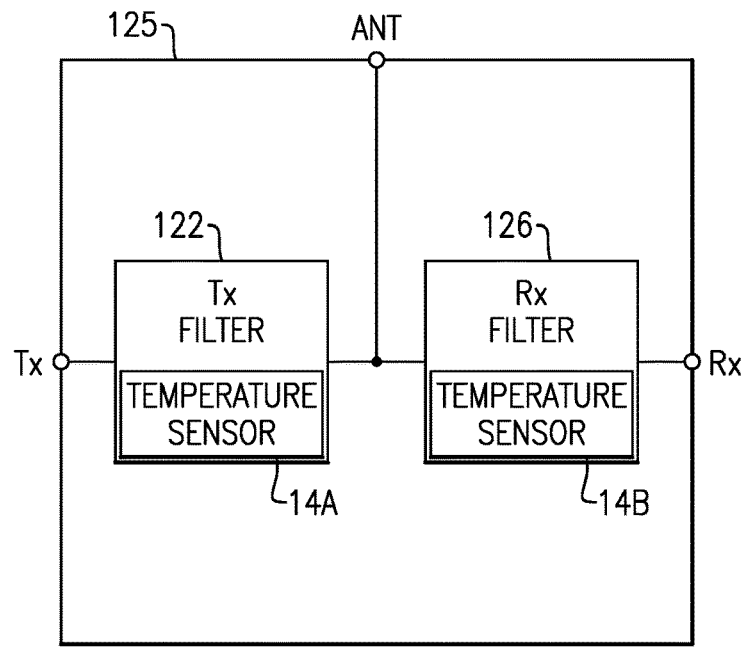
FIG. 12B is schematic block diagram of a duplexer that includes a transmit filter with a first integrated temperature sensor and a receive filter with a second integrated temperature sensor according to an embodiment.

FIG. 12B is schematic block diagram of a duplexer 125 that includes a transmit filter 122 with a first integrated temperature sensor 14A and a receive filter 126 with a second integrated temperature sensor 14B according to an embodiment. The transmit filter 122 and the receive filter 126 are both coupled to an antenna node ANT. The integrated temperature sensor 14B of the receive filter 126 can be implemented in accordance with any suitable principles and advantages discussed herein. FIG. 12B illustrates both a transmit filter and a receive filter of a duplexer can include integrated temperature sensors.

Figure 12C:
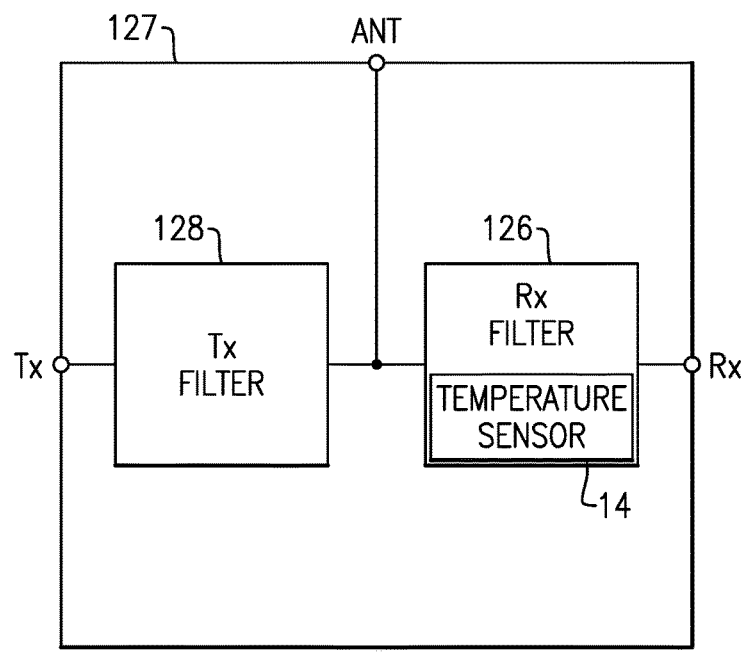
FIG. 12C is schematic block diagram of a duplexer that includes a receive filter with an integrated temperature sensor according to an embodiment.

FIG. 12C is schematic block diagram of a duplexer 127 that includes a receive filter 126 with an integrated temperature sensor 14 according to an embodiment. The duplexer 127 also includes a transmit filter 128 that is coupled to the receive filter 126 at an antenna node ANT. The illustrated transmit filter 128 does not include an integrated temperature sensor. FIG. 12C illustrates that in certain applications a duplexer can include a receive filter with an integrated temperature sensor and a transmit filter without an integrated temperature sensor.

Some RF systems can include forward power detection circuitry to monitor the output power of the RF system and/or a device that includes the RF system. An indication of the detected forward output power can be used in a feedback loop of a power amplifier control system to maintain a desired forward output power level. As VSWR in an RF system increases (e.g., a mobile phone including the RF system is placed in a metal desk drawer), the forward transmit power of the RF system typically decreases correspondingly. The power amplifier control system can cause the power amplifier drive level to increase to compensate for such a decrease in forward transmit power. In a filter (e.g., a SAW filter) arranged to filter an output of the power amplifier, this increase in RF input power to the filter can lead to more dissipated power within the filter, manifesting as an increase in the temperature. For filters with a negative temperature coefficient of frequency (TCF), this should result in a downward frequency shift of the pass band. If the RF system is operating at a frequency where the filter frequency response has a relatively steep negative slope, such as at the upper corner of the pass band, the downward shift of the pass band can cause a further significant increase in insertion loss. This can cause additional power dissipation within the filter and raise the temperature even more, as well as reduce output power, thereby causing the feedback loop to further increase the input power to the filter. The net result can be a positive feedback loop that can result in thermal runaway, which can lead to irreparable damage to the filter. The over temperature protection discussed herein can prevent such damage by sensing a temperature associated with a filter and reducing a signal level of an input to the filter in response to the temperature satisfying a threshold.

Figure 13:
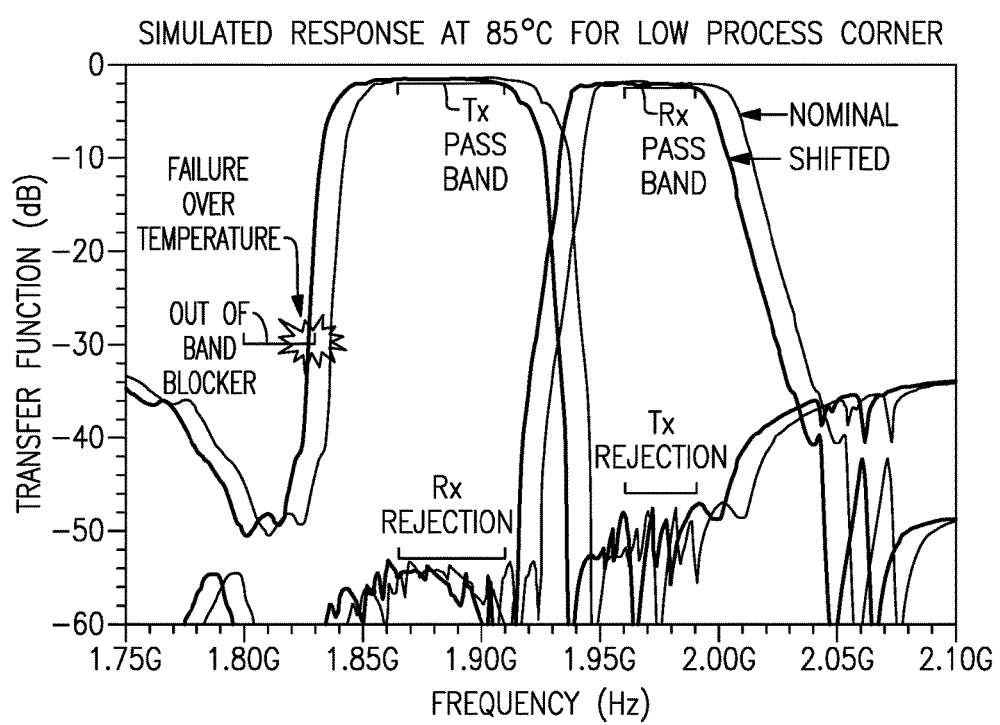
FIG. 13 is graph of a transfer function of a duplexer over frequency in which a shift in the transfer function can result in an out of band blocker failure.

FIG. 13 is graph of a transfer function of a duplexer over frequency in which a shift in the transfer function can result in an out of band blocker failure. The nominal response shown in FIG. 13 corresponds to typical operation. The shifted response corresponds to a high VSWR situation in which temperature of the duplexer increases. As shown in FIG. 13, the frequency response of the transmit filter can be shifted down in frequency as the temperature of the filter increases. This can cause an out of band blocker failure at high temperature. The over temperature protection discussed herein can prevent such a failure by sensing a temperature associated with a filter and reducing a signal level of an input to the filter in response to the temperature satisfying a threshold.

Figure 14:
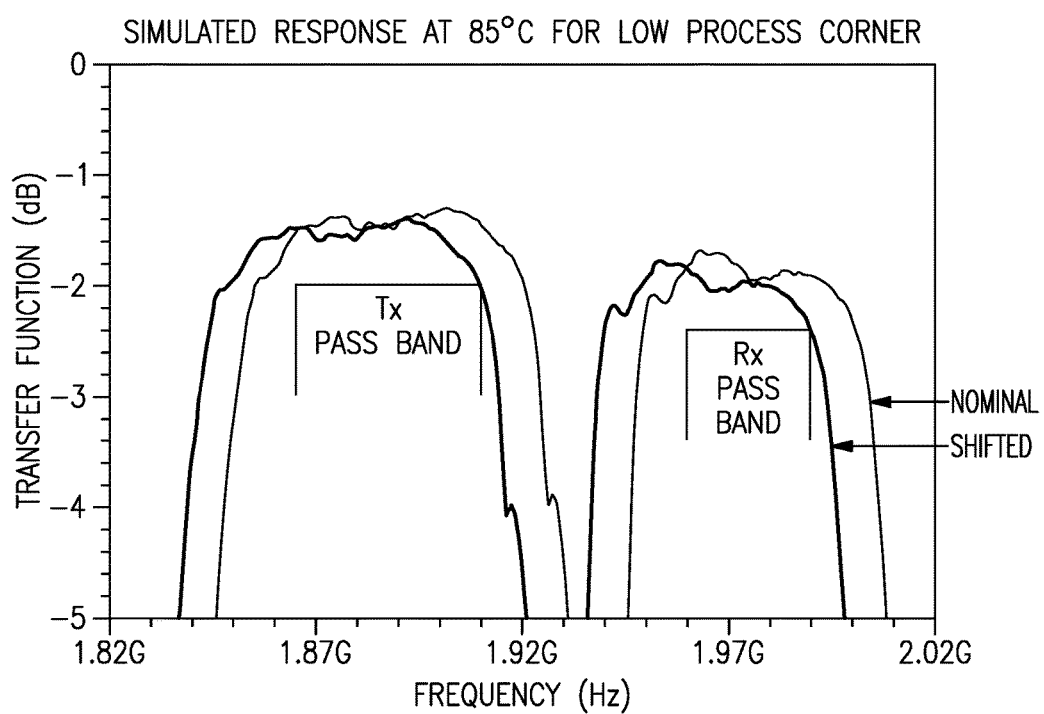
FIG. 14 is graph that zooms in on transmit and receive pass bands of the graph of FIG. 13.

FIG. 14 is a graph that zooms in on transmit and receive pass bands of the graph of FIG. 13. As shown in FIG. 14, the upper edge of transmit passband of the shifted response can be close to or at a sharp drop in the transfer function. This can be undesirable. The over temperature protection discussed herein can reduce an amount by which the transfer function shifts and/or prevent the illustrated shifted response from occurring.

Figure 15:
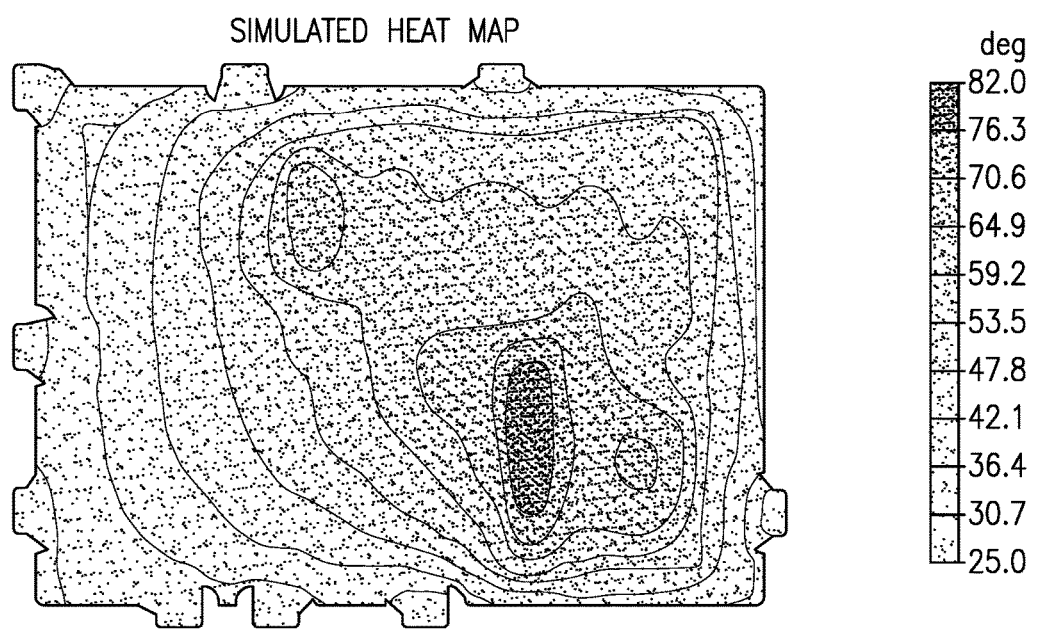
FIG. 15 is a simulated heat map of a surface acoustic wave duplexer.

FIG. 15 is a simulated heat map of a surface acoustic wave duplexer. This heat map shows that certain parts of a SAW duplexer are hotter than other parts. A temperature sensor, such as an RTD, can be positioned relatively close to a relatively hot area of the SAW duplexer. Accordingly, the temperature sensor can sense a temperature that is at or near a maximum temperature of the SAW duplexer.

FIG. 16A is a block diagram of a layout of an acoustic wave filter 160 with an integrated resistive thermal device according to an embodiment. As shown in FIG. 16, the acoustic wave filter 160 includes a filter substrate 162 on which resonators 164, a resistive thermal device 165, a ground contact 166, and a transmit port contact 167 are disposed. The resistive thermal device 165 can be positioned near a relatively high temperature portion of the acoustic wave filter 160. The resistive thermal device 165 can also be positioned close to the ground contact 166 and the transmit port contact 167 in certain instances. The resistive thermal device 165 can be connected between the transmit port contact 167 and the ground contact 166. The resistive thermal device 165 of the acoustic wave filter 160 can be connected like the resistive thermal device 56 of the acoustic wave filter 50 of FIGS. 5A and 5B. The transmit port contact 167 can include a pin, for example. The acoustic wave filter 160 can be embodied on a single die.

FIG. 16B is a block diagram of a layout of an acoustic wave filter 168 with an integrated resistive thermal device according to another embodiment. The acoustic wave 168 is like the acoustic wave filter 160 of FIG. 16A except that the acoustic wave filter includes a dedicated temperature sensing contact 169. The resistive thermal device 165 can be connected between the dedicated temperature contact port 169 and the ground contact 166. The resistive thermal device 165 of the acoustic wave filter 168 can be connected like the resistive thermal device 56 of the acoustic wave filter 80 of FIG. 8. In the acoustic wave filter 168, the resistive thermal device 165 can be configured as a reflective grating for one or more acoustic wave resonators of the resonators 164.

FIG. 17A illustrates a serpentine resistive thermal device configured as a grating for a surface acoustic wave resonator 170 according to an embodiment. FIG. 17A illustrates a 1-port SAW resonator. The surface acoustic wave resonator 170 includes a first grating 172, a second grating 174, and an interdigital transducer 176. The first grating 172, the second grating 174, and the interdigital transducer 176 can be disposed on a piezoelectric substrate. The piezoelectric substrate can be a lithium niobate substrate or a lithium tantalate substrate, for example. The first grating 172 and the second grating 174 are disposed on opposing sides of the interdigital transducer 174.

The first grating 172 is arranged as a resistive thermal device that includes metal strips arranged in series with each other. The illustrated resistive thermal device is serpentine in plan view. The resistive thermal device can include any suitable number of metal strips in series with each other to provide a desired resistance. The resistive thermal device can be coupled between a transmit port Tx and ground as illustrated. Alternatively, the thermal resistive device can be arranged between different nodes (for example, as shown in FIGS. 6 to 9). The metal strips of the resistive thermal device can include aluminum. The metal strips of the resistive thermal device can include the same material as metal strips of the interdigital transducer 176 and/or the second grating 174.

FIG. 17B illustrates a serpentine resistive thermal device configured as a grating for a surface acoustic wave resonator 178 according to another embodiment. The surface acoustic wave resonator 178 is like the surface acoustic wave resonator of FIG. 17A, except that the resistive thermal device is connected between a dedicated temperature sensing port $T_{SENSE}$ and ground.

Figure 18:
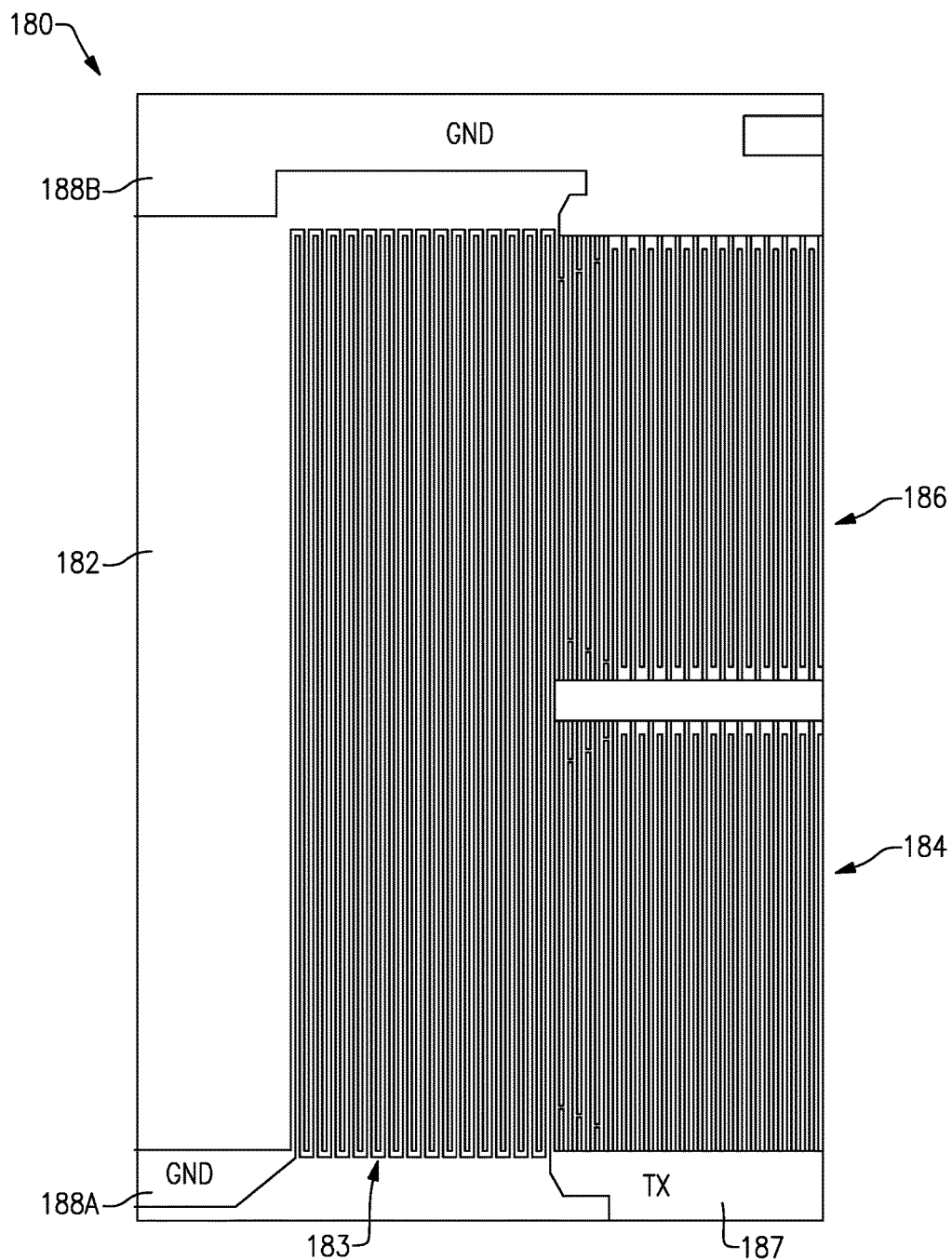
FIG. 18 illustrates a portion of a surface acoustic wave filter with an integrated resistive thermal device according to an embodiment.

FIG. 18 illustrates a portion 180 of a surface acoustic wave filter with an integrated resistive thermal device according to an embodiment. The surface acoustic wave filter includes a substrate 182, a resistive thermal device 183 on the substrate 182, interdigital transducers 184 and 186 on the substrate 182, a transmit port 187, and a ground pad 188A and 188B. As illustrated, the resistive thermal device 183 can function as grating for two resonators. The restive thermal device 183 is configured as an acoustic reflector for the first interdigital transducer 184 and the second interdigital transducer 186. The interdigital transducers 184 and 186 can be included in different resonators of a ladder filter. While the resistive thermal device 183 can function as a grating for two resonators as shown in FIG. 18, a resistive thermal device can function as a grating for any suitable number of SAW resonators. In some instances, gratings from several SAW resonators can be coupled together to form an resistive thermal device having a higher resistance and an averaged thermal response relative to an resistive thermal device formed of a grating for a single resonator.

In FIG. 18, the resistive thermal device 183 includes metal strips arranged in series between the transmit port 187 and ground. The metal strips of the resistive thermal device 183 can be formed of the same material as metals strips of the interdigital transducer 184. Such metal strips can be formed of any suitable metallic material. For instance, the metal strips can include aluminum (e.g., the metal strips can be aluminum or an alloy that includes aluminum). Portions of the ground pad 188A and 188B that can be electrically connected together are illustrated in FIG. 18.

Figure 19:
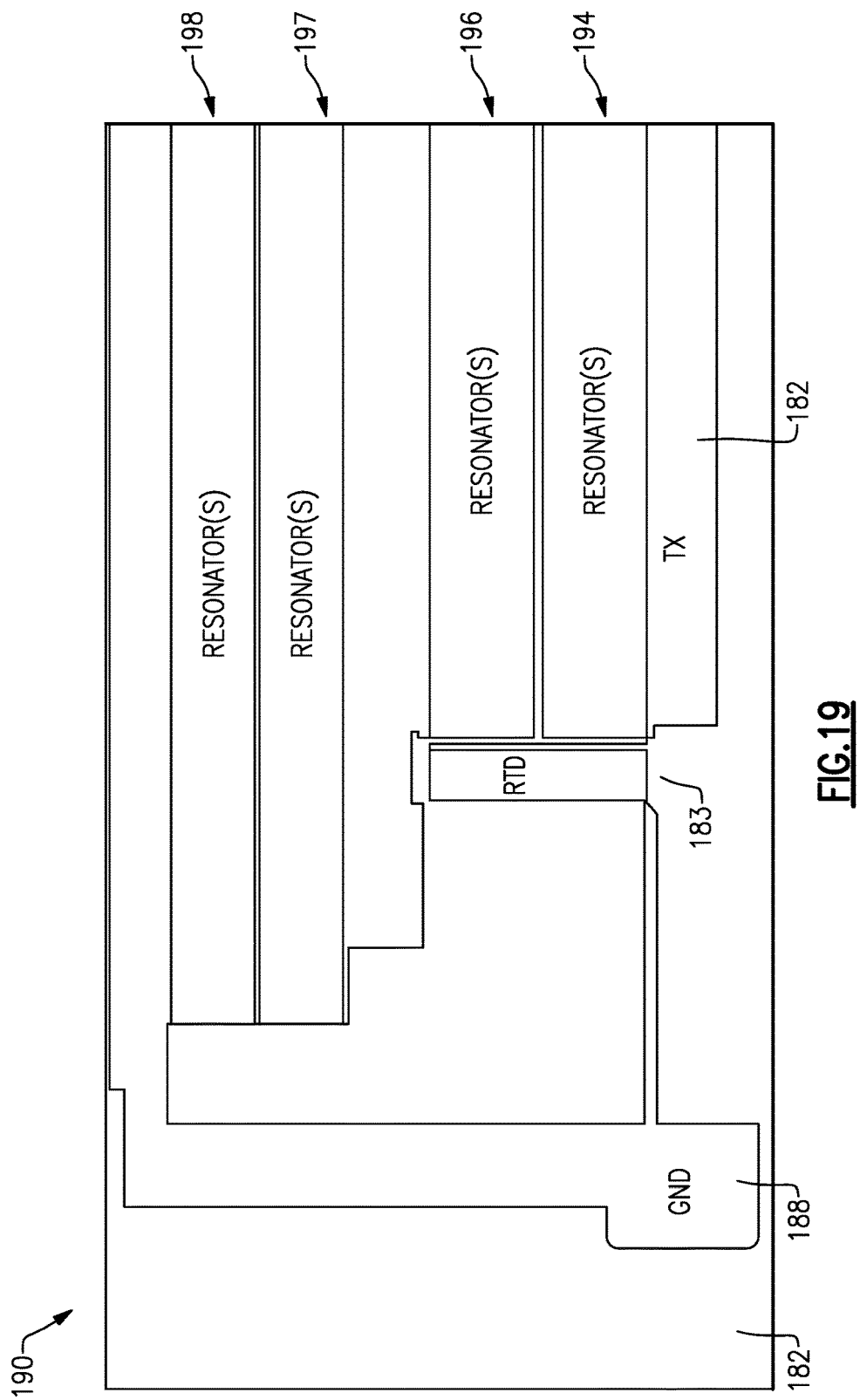
FIG. 19 illustrates a larger portion of the surface acoustic wave filter of FIG. 18.

FIG. 19 illustrates a larger portion 190 of the surface acoustic wave filter of FIG. 18. In FIG. 19, some portions of the surface acoustic wave filter are illustrated as blocks. As shown in FIG. 19, the surface acoustic wave filter includes resonator portions 194, 196, 197, and 198. One or more of the resonator portions can include resonators in parallel with each other configured to function as a composite resonator. Alternatively or additionally, one or more of the resonator portions can include two or more separate resonators of a ladder filter. FIG. 19 also illustrates ground pad 188 that includes ground pad portions 188A and 188B shown in FIG. 18. In addition, more of transmit port 187 is illustrated in FIG. 19 than in FIG. 18.

Figure 20:
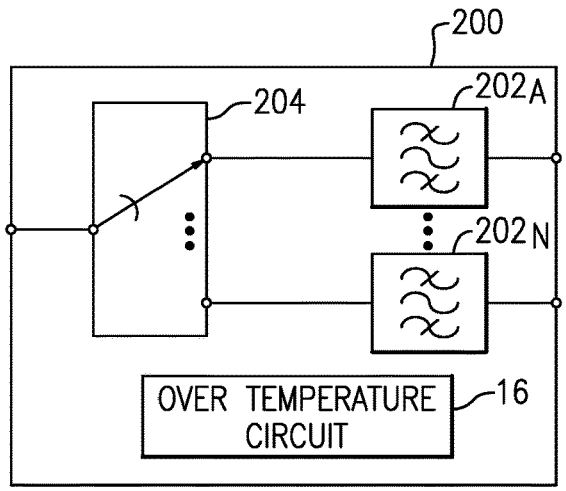
FIG. 20 is a schematic block diagram of a module that includes a filter and an over temperature circuit according to an embodiment.
Figure 21:
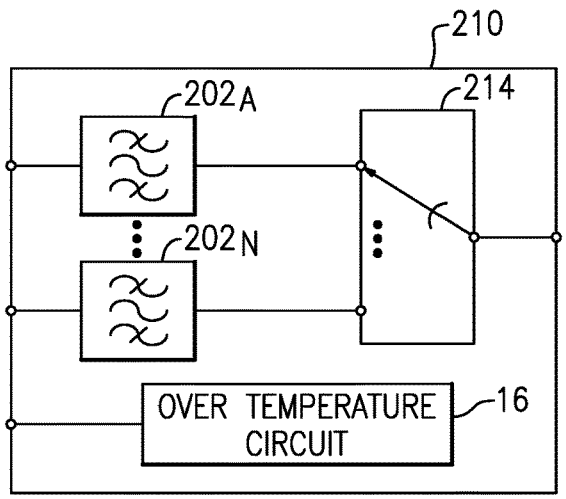
FIG. 21 is a schematic block diagram of a module that includes a filter and an over temperature circuit according to another embodiment.
Figure 22:
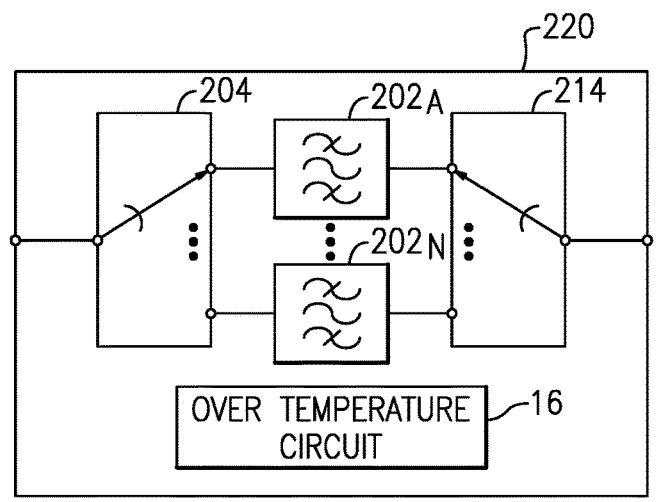
FIG. 22 is a schematic block diagram of a module that includes a filter and an over temperature circuit according to another embodiment.
Figure 23:
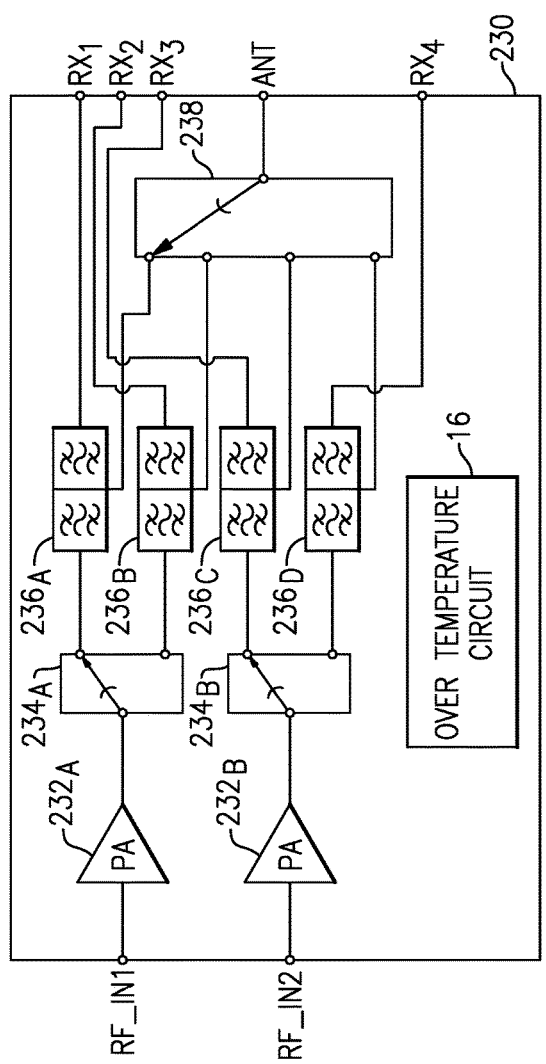
FIG. 23 is a schematic block diagram of a module that includes a filter and an over temperature circuit according to another embodiment.

Acoustic wave filters that include a temperature sensor can be implemented in a variety of modules. Any of the principles and advantages of an acoustic wave filter that includes a temperature sensor and/or an over temperature circuit can be implemented in a module as suitable. Modules can include circuits included within a common package. Accordingly, such modules can be referred to as packaged modules. A module can include one or more acoustic wave filters with an integrated temperature sensor, an over temperature circuit, one or more multi-throw radio frequency switches, one or more power amplifiers, or any suitable combination thereof. Such modules can be referred to as radio frequency modules, as these modules are configured to process a radio frequency signal. FIGS. 20 to 23 illustrate example modules with over temperature protection. Any suitable combination of features of these modules can be implemented. FIGS. 20 to 22 are examples of front end modules with integrated filters and radio frequency switches. FIG. 23 is an example of a module that includes a power amplifier with integrated duplexers and radio frequency switches.

FIG. 20 is a schematic block diagram of a module 200 that includes filters $202_A$ to $202_N$ and an over temperature circuit 16 according to an embodiment. The filters $202_A$ to $202_N$ can be transmit filters. Some or all of the filters $202_A$ to $202_N$ can be included in duplexers or other suitable multiplexers. A multi-throw radio frequency switch 204 can provide a radio frequency signal to a transmit port of a filter of the filters $202_A$ to $202_N$. The multi-throw radio frequency switch 204 can be a band select switch, for example. The filters $202_A$ to $202_N$ can be SAW filters, for example. Any suitable number of filters $202_A$ to $202_N$ can be included for a particular application. Some or all of the filters $202_A$ to $202_N$ can include a temperature sensor coupled to the over temperature circuit 16. The filters $202_A$ to $202_N$ can be band pass filters with different pass bands and/or filter characteristics (e.g., out of band attenuation, in band attenuation, symmetry or asymmetry about the pass band, etc., or any combination thereof).

The over temperature circuit 16 can detect that the temperature of a filter of the filters $202_A$ to $202_N$ satisfies a threshold. Responsive to detecting that the temperature of the filter satisfies the threshold, the over temperature circuit 16 can cause the multi-throw radio frequency switch 204 to decouple a radio frequency signal received at a common node from the filter in certain instances. Alternatively, the over temperature circuit 16 can assert an over temperature signal provided to circuitry arranged to generate the radio frequency signal provided to the common node of the multi-throw radio frequency switch 204 responsive to detecting that the temperature of the filter satisfies the threshold. Asserting such an over temperature signal can reduce the power level and/or signal level of the radio frequency signal.

FIG. 21 is a schematic block diagram of a module 210 that includes filters and an over temperature circuit according to another embodiment. The module 210 is like the module 200 of FIG. 20 except that the module 210 includes a multi-throw radio frequency switch 214 instead of the multi-throw radio frequency switch 204 of FIG. 20. The multi-throw radio frequency switch 214 has throws coupled to respective outputs of the filters $202_A$ to $202_N$. The multi-throw radio frequency switch 214 can provide an output of a selected filter of the filters $202_A$ to $202_N$ to a common node, such as an antenna port of the module 210. Responsive to detecting that the temperature of a filter satisfies the threshold, the over temperature circuit 16 assert an over temperature signal provided to circuitry arranged to generate the radio frequency signal provided to an input port of the filter. Asserting such an over temperature signal can reduce the power level and/or signal level of a radio frequency signal provided to the input port.

FIG. 22 is a schematic block diagram of a module 220 that includes filters and an over temperature circuit according to another embodiment. The module 220 includes a first multi-throw switch 204 and a second multi-throw switch 214. FIG. 22 illustrates that features of FIGS. 20 and 21 can be included within the same module.

FIG. 23 is a schematic block diagram of a module 230 that includes a filter and an over temperature circuit according to another embodiment. As illustrated, the module 230 includes power amplifiers 232A and 232B, select switches 234A and 234B, duplexers 236A, 236B, 236C, and 236D, an antenna switch 238, and an over temperature circuit 16.

The power amplifier 232A is arranged to amplify a first radio frequency signal RF_IN1. Similarly, the power amplifier 232B is arranged to amplify a second radio frequency signal RF_IN2. These power amplifiers can amplify radio frequency signals having different characteristics. The different characteristics can include more or more of being within different frequency bands, being at different power levels, being associated with different linearity and/or power added efficiency, or being associated with different modes of operation. In the module 230, one of the power amplifiers 232A and 232B can amplify a radio frequency signal at a given time. In some instances, two power amplifiers in a module can amplify different radio frequency signals concurrently. For instance, in a carrier aggregation mode, the two power amplifiers can concurrently amplify radio frequency signals that are within different frequency bands and that are combined using a frequency multiplexing circuit, such as a diplexer.

The select switch 234A can selectively electrically couple an output of the power amplifier 232A to a transmit port of a selected duplexer 236A or 236B. Similarly, the select switch 234B can selectively electrically couple an output of the power amplifier 232B to a transmit port of a selected duplexer 236C or 236D. The antenna switch 238 can electrically couple a selected duplexer to the antenna port ANT. In certain embodiments, the antenna switch can electrically couple two duplexers to the antenna port ANT in a carrier aggregation mode.

One or more of the duplexers 236A to 236D can include a transmit filter with an integrated temperature sensor. Such transmit filters can include SAW resonators. While four duplexers are illustrated, any suitable number of duplexers can be implemented. For instance, 3 or more duplexers can be coupled in a signal path between the select switch 234A and the antenna switch 238A. Moreover, while duplexers are illustrated, any suitable multiplexer that includes a filter with an integrated temperature sensor can be implemented. Such multiplexers can include a triplexer, a quadplexer, etc. in certain applications.

The over temperature circuit 16 can detect that the temperature of a filter of the duplexers 236A to 236N satisfies a threshold. Responsive to detecting that the temperature of the filter satisfies the threshold, the over temperature circuit 16 can cause the select switch 234A and/or 236B to decouple an amplified radio frequency signal received from a power amplifier from the filter. Alternatively, the over temperature circuit 16 can assert an over temperature signal provided to a power amplifier and/or circuitry arranged to generate a radio frequency signal provided to the power amplifier responsive to detecting that the temperature of the filter satisfies the threshold. Asserting such an over temperature signal can reduce the power level and/or signal level of the amplified radio frequency signal provided to the select switch.

Figure 24:
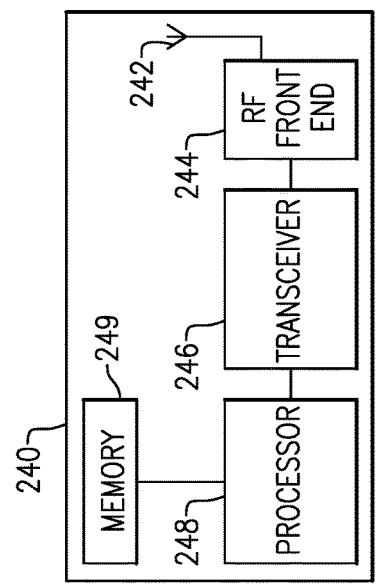
FIG. 24 is a wireless communication device that includes a radio frequency front end that can include a filter with an integrated temperature sensor according to one or more embodiments.

FIG. 24 is a schematic block diagram of a wireless communication device 240 that includes a radio frequency front end that can include a filter with an integrated temperature sensor according to one or more embodiments. The wireless communication device 240 can be any suitable wireless communication device. For instance, a wireless communication device 240 can be a mobile phone, such as a smart phone. As illustrated, the wireless communication device 240 includes an antenna 242, an RF front end 244, a transceiver 246, a processor 248, and a memory 249. The antenna 242 can transmit RF signals provided by the RF front end 244. The antenna 242 can transmit carrier aggregated signals provided by the RF front end 244. The antenna 242 can provide received RF signals to the RF front end 244 for processing.

The RF front end 244 can include one or more power amplifiers, one or more low noise amplifiers, RF switches, receive filters, transmit filters, duplex filters, or any combination thereof. The RF front end 244 can transmit and receive RF signals associated with any suitable communication standards. One or more filters with an integrated temperature sensor in accordance with any suitable principles and advantages discussed herein can be included in the RF front end 244. The RF front end 244 can include an over temperature circuit in accordance with any suitable principles and advantages discussed herein.

The RF transceiver 246 can provide RF signals to the RF front end 244 for amplification and/or other processing. The RF transceiver 246 can also process an RF signal provided by a low noise amplifier of the RF front end 244. The RF transceiver 246 can include one or more circuits configured to receive an over temperature signal and to reduce a power level and/or signal level of a radio frequency signal provided to the RF front end 244 in response to the over temperature signal being asserted. For instance, the RF transceiver 246 can provide one or more signals to a transmit path to adjust power of a carrier based on the over temperature protection signal.

The illustrated RF transceiver 246 is in communication with the processor 248. The processor 248 can be a baseband processor. The processor 248 can provide any suitable baseband processing functions for the wireless communication device 240. The memory 249 can be accessed by the processor 248. The memory 249 can store any suitable data for the wireless communication device 240.

Any of the principles and advantages discussed herein can be applied to other systems, modules, filters, multiplexers, wireless communication devices, and methods not just to the systems, modules, filters, multiplexers, wireless communication devices, and methods described above. The elements and operations of the various embodiments described above can be combined to provide further embodiments. Some of the embodiments described above have provided examples in connection with surface acoustic wave filters and/or transmit filters. However, the principles and advantages of the embodiments can be used in connection with any other systems, apparatus, or methods that benefit could from any of the teachings herein. For instance, any of the principles and advantages discussed herein can be implemented in connection with providing over temperature protection for any suitable filter. As another example, any suitable principles and advantages of the acoustic wave devices discussed herein can be implemented in radio frequency systems to perform functions other than over temperature protection, such as compensating for a change in frequency response of a filter due to changes in temperature. As one more example, any suitable principles and advantages discussed herein can be applied to an integrated passive device die that includes a filter with an integrated temperature sensor. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A radio frequency system with over temperature protection, the radio frequency system comprising:
    a surface acoustic wave filter configured to filter a radio frequency signal, the surface acoustic wave filter including an integrated temperature sensor, the integrated temperature sensor including a resistive thermal device having a resistance in a range from 1 kΩ to 10 kΩ, and the resistance is configured to change with temperature;
    a radio frequency signal path configured to provide the radio frequency signal to the surface acoustic wave filter; and
    an over temperature circuit configured to reduce a power level of the radio frequency signal responsive to an indication of temperature provided by the temperature sensor satisfying a threshold.

2. The radio frequency system of claim 1 wherein the resistive thermal device is arranged as a grating for at least one surface acoustic wave resonator of the surface acoustic wave filter.

3. The radio frequency system of claim 1 wherein the resistive thermal device includes metal strips arranged in series with each other.

4. The radio frequency system of claim 1 wherein the radio frequency signal path includes a power amplifier operatively coupled to the surface acoustic wave filter, and the over temperature circuit is configured to reduce the power level of the radio frequency signal by reducing a power level of an input signal to the power amplifier.

5. The radio frequency system of claim 1 wherein the radio frequency signal path includes a power amplifier operatively coupled to the surface acoustic wave filter, and the over temperature circuit is configured to reduce the power level of the radio frequency signal by attenuating an output signal of the power amplifier.

6. A radio frequency system with over temperature protection, the radio frequency system comprising:
    a surface acoustic wave filter configured to filter a radio frequency signal, the surface acoustic wave filter including an integrated temperature sensor;

a radio frequency signal path configured to provide the radio frequency signal to the surface acoustic wave filter, the radio frequency signal path including a power amplifier operatively coupled to the surface acoustic wave filter; and an over temperature circuit configured to reduce a power level of the radio frequency signal responsive to an indication of temperature provided by the temperature sensor satisfying a threshold, and the over temperature circuit being configured to reduce the power level of the radio frequency signal by decoupling an output of the power amplifier from an input to the surface acoustic wave filter using a switch.

7. The radio frequency system of claim 6 wherein the integrated temperature sensor includes a resistive thermal device having a resistance that changes with temperature.

8. The radio frequency system of claim 7 wherein the resistance is in a range from 1 kΩ to 10 kΩ.

9. The radio frequency system of claim 6 wherein the resistive thermal is connected between ground and an input port of the filter configured to receive the radio frequency signal.

10. The radio frequency system of claim 6 wherein the resistive thermal is connected between ground and an antenna port of the filter.

11. A surface acoustic wave filter comprising:
surface acoustic wave resonators configured to filter a radio frequency signal; and
a resistive thermal device having a resistance that changes with temperature, the resistance being at least 500Ω, and the resistive thermal device including metal strips arranged in series with each other and configured as a reflective grating of a surface acoustic wave resonator of the surface acoustic wave resonators.

12. The surface acoustic wave filter of claim 11 wherein the resistive thermal device is connected to a dedicated temperature sensing port of the surface acoustic wave filter.

13. The surface acoustic wave filter of claim 11 wherein the resistance is in a range from 1 kΩ to 10 kΩ.

14. The surface acoustic wave filter of claim 11 wherein the resistive thermal device is positioned adjacent to an area of the surface acoustic wave filter having a high power dissipation relative to other areas of the surface acoustic wave filter.

15. The surface acoustic wave filter of claim 11 wherein the resistive thermal device is configured as a reflective grating for a second surface acoustic wave resonator of the surface acoustic wave resonators.

16. A packaged module comprising:
a surface acoustic wave filter configured to filter a radio frequency signal, the surface acoustic wave filter including an integrated temperature sensor, the integrated temperature sensor including a resistive thermal device that includes metal strips arranged in series with each other and configured as a reflective grating for at least one surface acoustic wave resonator of the surface acoustic wave filter, and the resistive thermal device having a resistance of at least 500Ω;

an over temperature circuit operatively coupled to the integrated temperature sensor, the over temperature circuit configured to reduce a power level of the radio frequency signal responsive to an indication of temperature provided by the temperature sensor satisfying a threshold; and a package enclosing the surface acoustic wave filter and the over temperature circuit.

17. The packaged module of claim 16 wherein the over temperature circuit is configured to reduce the power level of the radio frequency signal by decoupling an output of the power amplifier from an input to the surface acoustic wave filter using a switch.

18. The packaged module of claim 16 wherein the resistance is in a range from 1 kΩ to 10 kΩ.

19. The packaged module of claim 16 wherein the surface acoustic wave filter is a transmit filter of a duplexer.

20. The packaged module of claim 16 further comprising a second acoustic wave filter and a multi-throw switch enclosed within the package, the multi-throw switch having a first throw coupled to the surface acoustic wave filter and a second throw coupled to the second acoustic wave filter.

21. A surface acoustic wave filter comprising:
surface acoustic wave resonators configured to filter a radio frequency signal; and
a resistive thermal device having a resistance that changes with temperature, the resistive thermal device being connected between an input port of the surface acoustic wave filter and ground, and the resistive thermal device including metal strips arranged in series with each other and configured as a reflective grating of a surface acoustic wave resonator of the surface acoustic wave resonators.

22. The surface acoustic wave filter of claim 21 wherein the resistive thermal device has a resistance of at least 500Ω.

23. The surface acoustic wave filter of claim 21 wherein the resistance of the resistive thermal device is in a range from 1 kΩ to 10 kΩ.

24. The surface acoustic wave filter of claim 21 wherein the resistive thermal device is configured as a reflective grating for a second surface acoustic wave resonator of the surface acoustic wave resonators.

* * * * *